United States Patent
Xie et al.

(10) Patent No.: US 10,665,590 B2
(45) Date of Patent: May 26, 2020

(54) WRAP-AROUND CONTACT SURROUNDING EPITAXIAL REGIONS OF INTEGRATED CIRCUIT STRUCTURES AND METHOD OF FORMING SAME

(71) Applicant: GLOBALFOUNDRIES INC., Grand Cayman (KY)

(72) Inventors: Ruilong Xie, Niskayuna, NY (US); William Taylor, Malta, NY (US); Hui Zang, Guilderland, NY (US)

(73) Assignee: GLOBALFOUNDRIES Inc., Malta, NY (US)

( * ) Notice: Subject to any disclaimer, the term of this patent is extended or adjusted under 35 U.S.C. 154(b) by 0 days.

(21) Appl. No.: 16/162,373

(22) Filed: Oct. 16, 2018

(65) Prior Publication Data

US 2020/0119002 A1   Apr. 16, 2020

(51) Int. Cl.
*H01L 29/66* (2006.01)
*H01L 27/088* (2006.01)
*H01L 29/78* (2006.01)
*H01L 21/8234* (2006.01)

(52) U.S. Cl.
CPC .. *H01L 27/0886* (2013.01); *H01L 21/823431* (2013.01); *H01L 21/823468* (2013.01); *H01L 29/66545* (2013.01); *H01L 29/66795* (2013.01); *H01L 29/785* (2013.01); *H01L 2029/7858* (2013.01)

(58) Field of Classification Search
CPC ............ H01L 29/66795; H01L 29/785; H01L 29/7851; H01L 29/41791; H01L 29/42392; H01L 27/0886; H01L 21/845; H01L 21/26586; H01L 2029/7858; H01L 21/0245; H01L 29/0847; H01L 29/66545; H01L 29/7848

See application file for complete search history.

(56) References Cited

U.S. PATENT DOCUMENTS

| | | | |
|---|---|---|---|
| 9,553,173 B1 * | 1/2017 | Lam | H01L 29/66795 |
| 9,812,453 B1 | 11/2017 | Mulfinger et al. | |
| 2007/0075372 A1 * | 4/2007 | Terashima | H01L 29/7854 257/360 |
| 2013/0037857 A1 * | 2/2013 | Von Kanel | H01L 21/0237 257/190 |
| 2016/0148936 A1 * | 5/2016 | Xu | H01L 27/0924 257/369 |
| 2016/0284929 A1 * | 9/2016 | Bender | H01L 33/0054 |
| 2016/0343623 A1 * | 11/2016 | Fogel | H01L 21/82387 |

* cited by examiner

*Primary Examiner* — Caridad Everhart
(74) *Attorney, Agent, or Firm* — David Cain

(57) ABSTRACT

The present disclosure relates to integrated circuit (IC) structures and their method of manufacture. More particularly, the present disclosure relates to forming a semiconductor device having generally fork-shaped contacts around epitaxial regions to increase surface contact area and improve device performance. The integrated circuit (IC) structure of the present disclosure comprises a plurality of fins disposed on a semiconductor substrate, at least one epitaxial region laterally disposed on selected fins, and a contact material positioned over and surrounding the epitaxial region.

20 Claims, 19 Drawing Sheets

WRAP-AROUND CONTACT SURROUNDING EPITAXIAL REGIONS OF INTEGRATED CIRCUIT STRUCTURES AND METHOD OF FORMING SAME

FIELD OF THE INVENTION

The present disclosure relates to integrated circuit (IC) structures and their method of manufacture. More particularly, the present disclosure relates to forming a semiconductor device having generally fork-shaped contacts around epitaxial regions to increase contact area and improve device performance.

BACKGROUND

Fin-type field effect transistors ("FinFETs") have become increasingly widespread in advanced manufacturing of ICs because FinFETs offer better electrostatic control over the behavior in the channel than planar field-effect-transistors (FETs). A FinFET generally includes source, drain, and gate regions, wherein the gate region is placed between the source and drain regions and controls the current through a channel region (often shaped as a semiconductor fin) between the source and drain regions. FinFETs are generally formed by creating a number of semiconductor fins on a substrate and placing a gate conductor perpendicularly across the fins. By applying an appropriate voltage to the gate electrode, the channel region becomes conductive and current is allowed to flow from the source region to the drain region. Contacts to each of the source, drain, and gate regions through a dielectric layer provide electrical connection with other integrated circuit components (e.g., transistors, capacitors etc.) or metal layers that are formed on a substrate.

To improve the operating speed of FinFETs and to increase the density of FinFETs on an integrated circuit, device designers have greatly reduced the physical size of FinFETs over the years. There are a number of challenges that arise as feature sizes of FinFETs and integrated circuits get smaller.

For example, in FinFETs, a wrap-around contact (WAC) may be formed over most of the outer surface of source/drain regions in order to reduce contact resistance in the FinFET. To ensure that the WAC is formed around most of the outer surface of source/drain regions, a large contact area is typically etched over the source/drain regions such that all outer surfaces of the source/drain regions are exposed. However, the large contact area limits the device scaling, because the spacing between individual devices is limited by the width of the contact area used to form the WAC. Therefore, as FinFETs continue to scale downward in size, it is desirable to optimize the WAC area over the outer surface of source/drain regions.

SUMMARY

In one aspect of the present disclosure, there is provided an integrated circuit (IC) structure including a plurality of fins disposed on a semiconductor substrate, at least one epitaxial region laterally disposed on selected fins, and a contact material positioned over and surrounding the epitaxial region. Each epitaxial region has tapered portions positioned over the selected fins.

In another aspect of the present disclosure, there is provided an IC structure including a plurality of fins disposed on a semiconductor substrate, at least one epitaxial region laterally disposed on selected fins, and at least one contact material positioned over and surrounding the epitaxial region. Each epitaxial region has tapered portions positioned over the selected fins, and the one epitaxial region is separated from another epitaxial region by an interlayer dielectric, and the one contact material is separated from another contact material by the interlayer dielectric.

In another aspect of the present disclosure, there is provided a method for forming an IC structure including forming a device structure having a plurality of fins disposed on a semiconductor substrate, a hard mask layer disposed on the plurality of fins, and at least one dummy gate region having a pair of gate sidewall spacers and a sacrificial gate material that is disposed on the hard mask layer. The method also includes etching selected fins to form cavities under the hard mask layer, forming at least one epitaxial region that fills the cavities and extends laterally across the selected fins, removing portions of the epitaxial region to form tapered structures positioned over the selected fins, forming a contact cavity around the epitaxial region and filling the contact cavity with a contact material to surround the epitaxial region.

BRIEF DESCRIPTION OF THE DRAWINGS

The present disclosure may be understood by reference to the following description taking in conjunction with the accompanying drawings.

For simplicity and clarity of illustration, the drawings illustrate the general manner of construction, and certain descriptions and details of well-known features and techniques may be omitted to avoid unnecessarily obscuring the discussion of the described embodiments of the structure. Additionally, elements in the drawings are not necessarily drawn to scale. For example, the dimensions of some of the elements in the drawings may be exaggerated relative to other elements to help improve understanding of embodiments of the device. The same reference numerals in different drawings denote the same elements, while similar reference numerals may, but do not necessarily, denote similar elements.

DETAILED DESCRIPTION

Various illustrative embodiments of the present disclosure are described below. The embodiments disclosed herein are exemplary and not intended to be exhaustive or limiting to the present disclosure.

Figure 1:
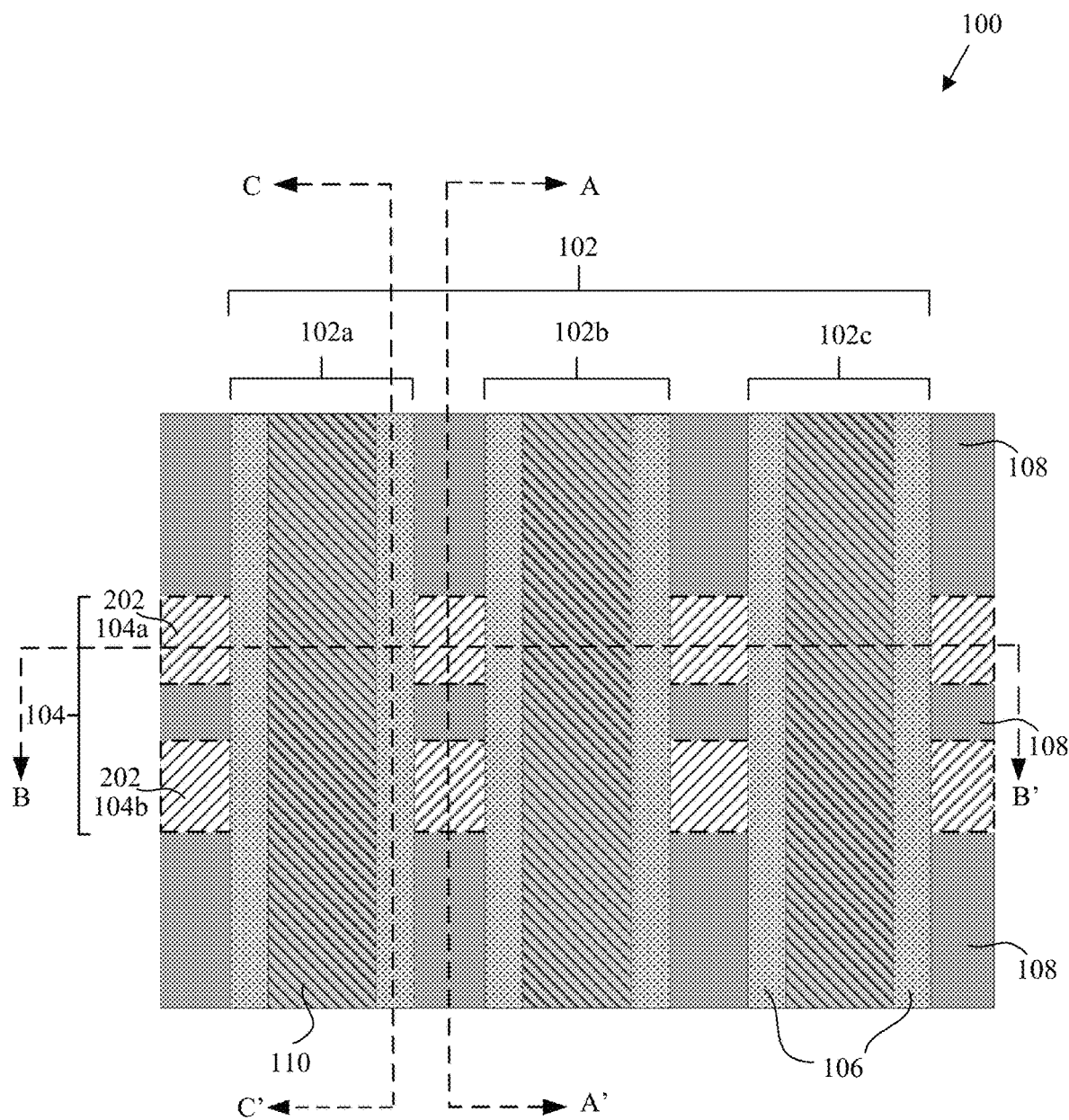
FIG. 1 shows a top-down view of an example of a device structure according to embodiments of the present disclosure. The line A-A' designates the cross section location for FIGS. 2A-15A, the line B-B' designates the cross section location for FIGS. 2B-15B, and the line C-C' designates the cross section location for FIGS. 6C-7C.

FIG. 1 is a top-down view of the device structure 100. In the following FIGS. 2 to 15, the figures suffixed with "A" are a cross section of the partially processed IC structure along a line corresponding to the section line A-A' and the figures suffixed with "B" are cross sections of the same partially processed IC structure along a line corresponding to the section line B-B', as shown in FIG. 1. Similarly, FIGS. 6C-7C have a suffix "C" and are cross sections corresponding to the section line C-C' for the partially processed IC structures shown in FIGS. 6 and 7, respectively.

The device structure 100 illustrates one set of device elements targeted for use with embodiments of the present disclosure, but it is understood that embodiments of the present disclosure can be implemented on different designs without any change to the techniques discussed herein. The device structure 100 may be fabricated by known semiconductor processes. The device structure 100 includes a plurality of fins 104 and at least one dummy gate region 102. Each dummy gate region 102a, 102b and 102c is positioned over the plurality of fins 104. Each fin 104a and 104b of the plurality of fins 104 is separated from each other by shallow isolation trenches 108. A hard mask layer 202 is disposed on fins 104a and 104b. As shown in FIG. 1, a dotted rectangular box outlining the hard mask layer 202 indicates that the fins 104a and 104b are positioned below the hard mask layer 202.

Each fin 104a and 104b may include any suitable semiconductor material such as silicon, germanium, or silicon germanium. In one embodiment, the semiconductor material in the fin is preferably silicon. The shallow isolation trenches 108 may include any suitable insulating material such as silicon dioxide or silicon nitride. In another embodiment, the insulating material in the shallow isolation trenches is preferably silicon dioxide.

Figure 2A:
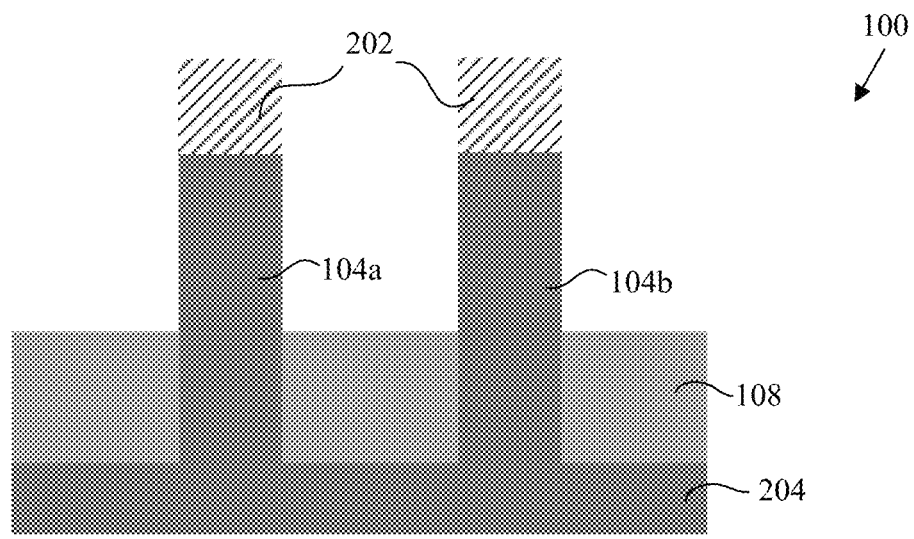
FIGS. 2A and 2B show cross section views of the example device structure shown in FIG. 1 in accordance with some embodiments of the present disclosure.
Figure 2B:
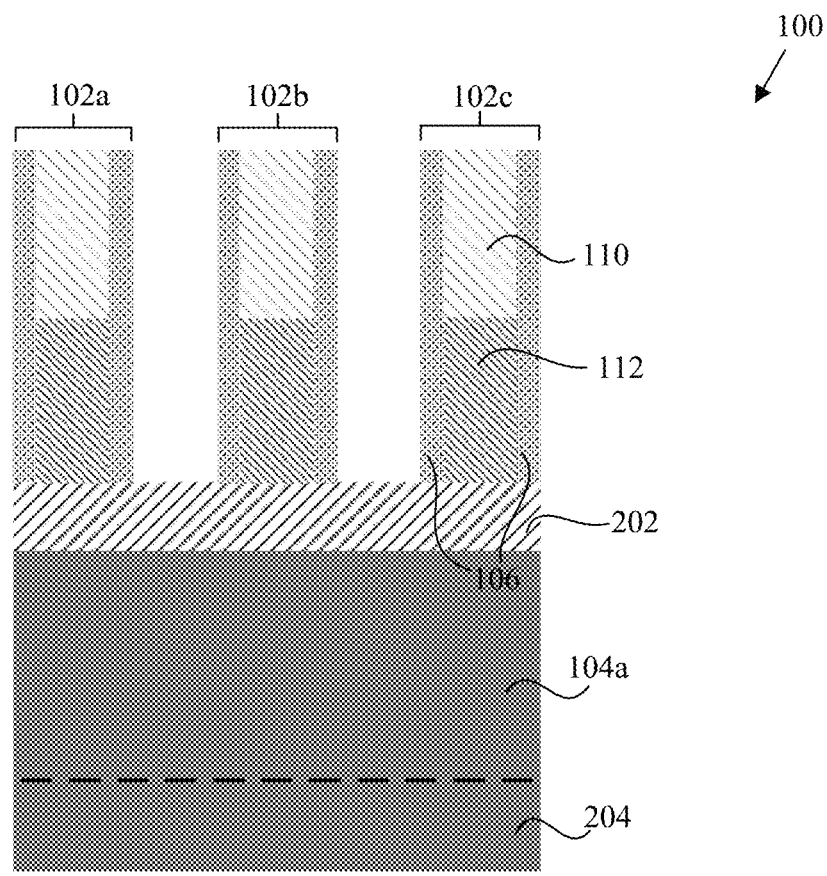

Referring to FIGS. 2A and 2B, cross-sections of the device structure 100 are depicted. The device structure 100 includes selected fins 104a and 104b disposed on a substrate 204 isolated by shallow isolation trenches 108. As shown in FIG. 2A, the hard mask layer 202 is disposed on the fins 104a and 104b. The hard mask layer 202 may include silicon carbide. Each dummy gate region 102a, 102b and 102c includes a pair of gate sidewall spacers 106, a protective cap 110, and a sacrificial gate material 112. The protective cap 110 is disposed on the sacrificial gate material 112. The gate sidewall spacers 106 may include an insulating material, such as silicon dioxide or silicon nitride. The gate sidewall spacers 106 and the sacrificial gate material 112 are disposed on the hard mask layer 202. The sacrificial gate material 112 may include polysilicon. The protective cap 110 may include an insulating material, such as silicon nitride. In some embodiments, it is preferred that each fin 104a and 104b has a width of about 6 nm.

The substrate 204 may be made of any suitable semiconductor material, such as silicon, germanium, silicon germanium, silicon carbide, and those consisting essentially of III-V compound semiconductors, such as GaAs, II-VI compound semiconductors such as ZnSe. The substrate 204 may also include an organic semiconductor or a layered semiconductor, such as Si/SiGe, a silicon-on-insulator or a SiGe-on-insulator. A portion or entire semiconductor substrate 204 may be amorphous, polycrystalline, or monocrystalline. In one embodiment, the substrate 204 is preferably a silicon substrate.

Figure 3A:
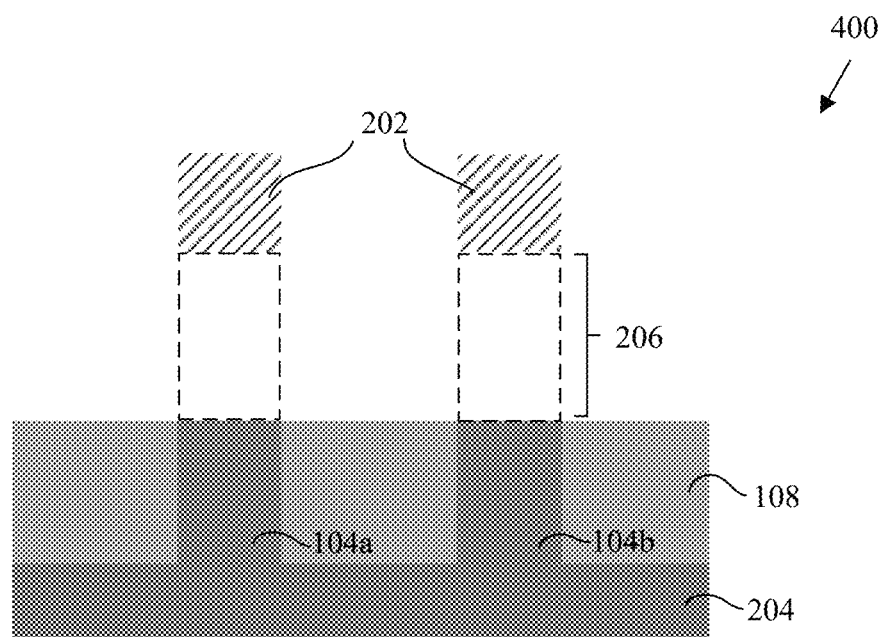
FIGS. 3A and 3B show cross section views of a partially processed IC structure after removing upper portions of the fins to form cavities in accordance with some embodiments of the present disclosure.
Figure 3B:
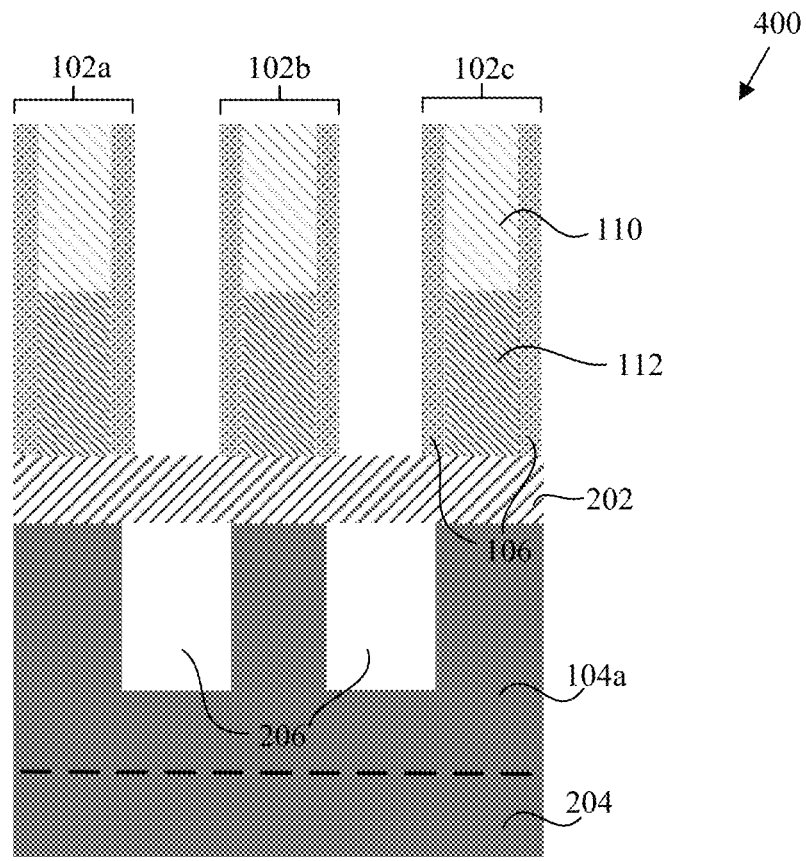

FIGS. 3A and 3B show cross-sections of a partially processed IC structure 400 after performing removal of upper portions of fins 104a and 104b to form cavities 206. As shown in FIG. 3A, the upper portions of fins 104a and 104b that had been removed is indicated by a dotted rectangular box. As shown in FIG. 3B, cavities 206 are formed directly underneath the hard mask layer 202. The removal of the upper portion of fins 104a and 104b may be performed by isotropic etching or dry etch. While it is preferred that the upper portions of fins 104a and 104b be completely removed, in an alternative embodiment (not shown), the width of fins 104a and 104b may be reduced, with about 1 to 3 nm trimmed from each side of the fin.

Figure 4A:
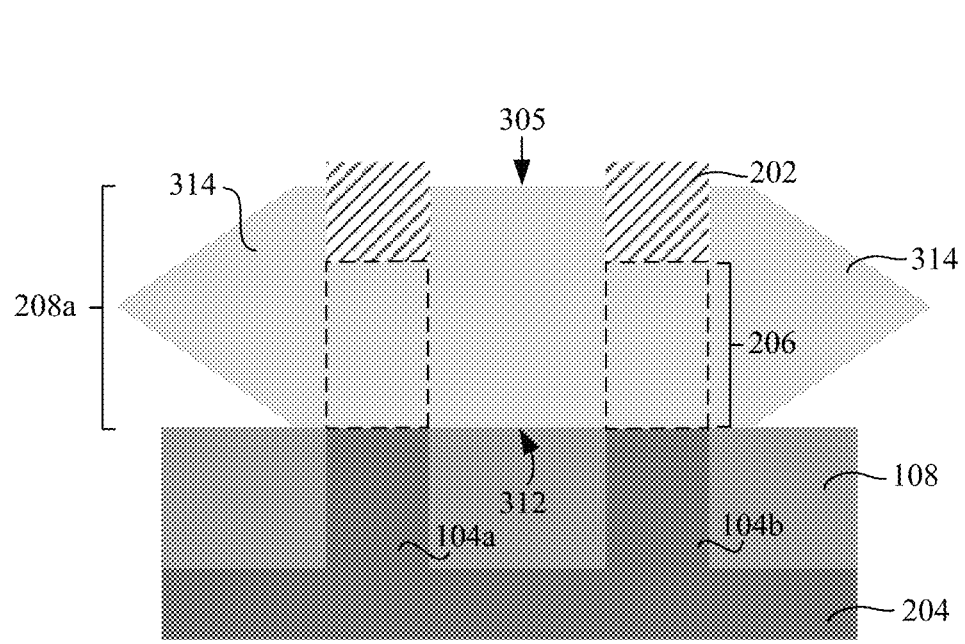
FIGS. 4A and 4B show cross section views of a partially processed IC structure after forming at least one epitaxial region in the previously formed cavities in accordance with some embodiments of the present disclosure.
Figure 4B:
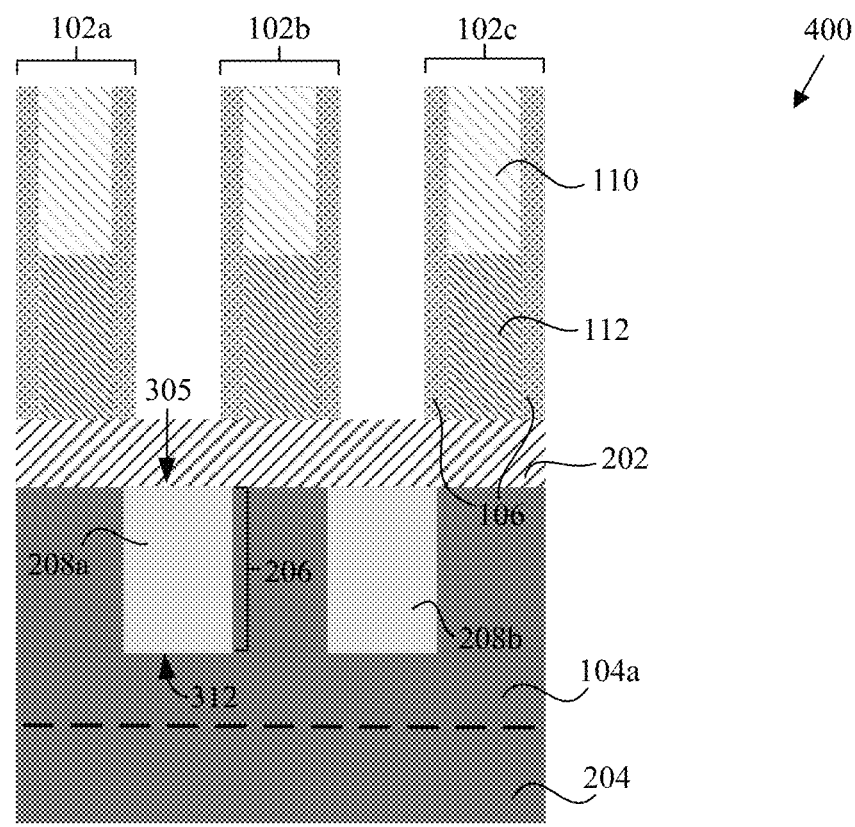

FIGS. 4A and 4B show cross-sections of a partially processed IC structure 400 after forming at least one epitaxial region 208a and 208b on the fins 104a and 104b. The term "epitaxial region" as used herein includes a region of a field effect transistor (FET) that functions as a source and drain. As shown in FIG. 4A, the epitaxial region 208a extends laterally, filling the previously formed cavities 206 for each fin 104a and 104b, as indicated by a dotted rectangular box. The epitaxial region 208a includes a top surface 305, a bottom surface 312, and side portions 314. The top surface 305 of the epitaxial region 208a may be raised to an elevation higher than the hard mask layer 202, or to the same elevation as the hard mask layer 202.

In the embodiments, the formation of each epitaxial region 208a and 208b begins by growing smaller structures having a diamond-like shape in the cavities 206. The epitaxial growth of diamond shaped structures in the lateral direction causes them to merge with adjacent diamond shaped structures, which results in the epitaxial region 208a shown in FIG. 4A. Although not shown, it should be understood that additional epitaxial regions may be formed adjacent to the epitaxial region 208a and 208b. The term "epitaxial growth" as used herein refers to the growth of a semiconductor material on a deposition surface of a same or different semiconductor material, in which the grown semiconductor material will have the same crystalline characteristics as the deposition surface of the semiconductor material. In various embodiments, the epitaxial region may include, but not limited to, silicon, germanium, or silicon germanium.

Figure 5A:
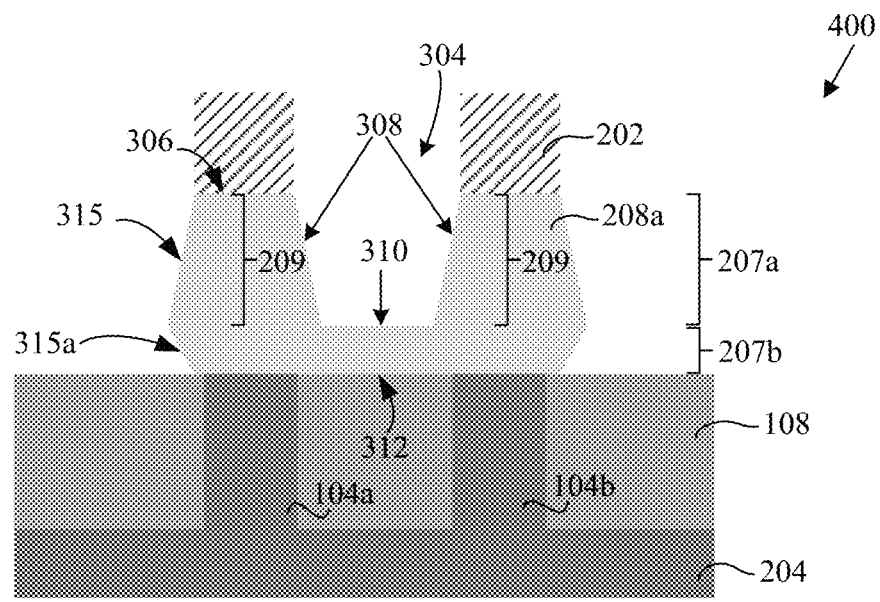
FIGS. 5A and 5B show cross section views of a partially processed IC structure after removing portions of each epitaxial region to form tapered structures in accordance with some embodiments of the present disclosure.
Figure 5B:
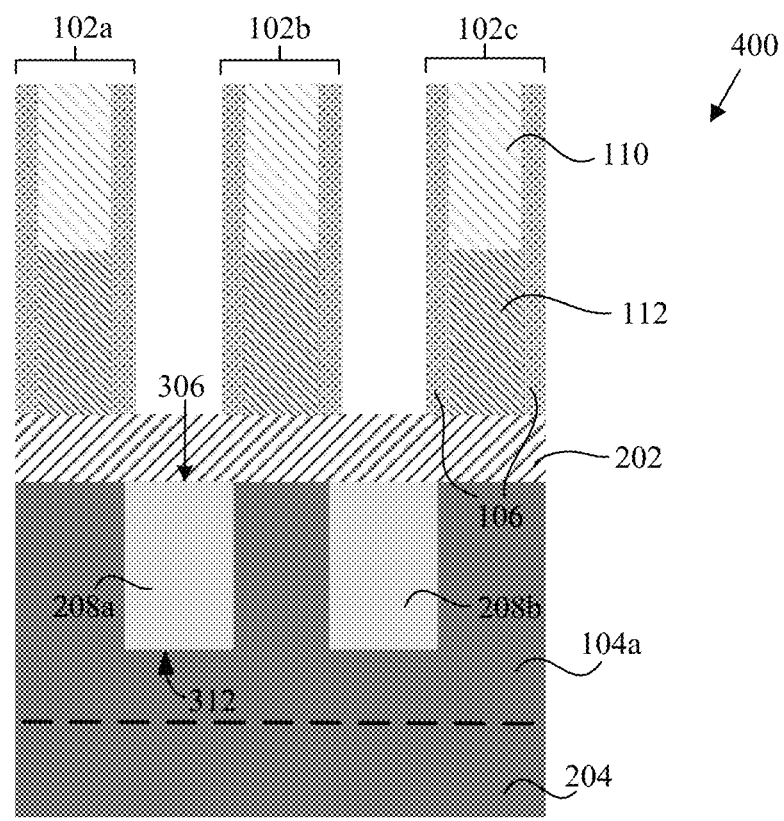

Referring to FIGS. 5A and 5B, there is shown a partially processed IC structure 400 after removing portions of the epitaxial regions 208a and 208b (not shown) to form tapered structures 209 positioned over the fins 104a and 104b. Removing portions of the epitaxial region 208a may include etching to form a top section 207a that includes the tapered structures 209, and a base section 207b having outer sidewall surfaces. The term "tapered" as used herein refers to a surface profile of a sidewall that has an angle of less than 90 degrees measured with respect to a horizontal plane. As used herein, the term "tapered" also encompasses "rounded" and "beveled" in which sharp corners or edges are blended to render less distinct the surfaces that form the sharp corners and edges.

In some embodiments, portions of the epitaxial region 208a are removed such that the top section 207a has two adjacent tapered structures 209 having top surfaces 306 and outer sidewall surfaces 315, and a tapered recess 304. The tapered recess 304 is positioned between the tapered structures 209 and forms inner sidewall surfaces 308 of the tapered structures 209. The tapered structure 209 has their outer sidewall surface 315 and inner sidewall surface 308 taper towards each other as they meet the top surface 306. The tapered recess 304 has a recess bottom surface 310. The recess bottom surface 310 may have a concave profile, a V-shaped profile or a flat profile. In the embodiments, the recess bottom surface 310 has a flat profile, as shown in FIG. 5A.

In some embodiments, the top surfaces 306 are preferably spaced apart from each other with a distance of about 14 nm to 28 nm. The recess bottom surface 310 has a preferred width of about 3 nm to 26 nm. Each inner sidewall surface 308 of the tapered structure 209 has a preferred angle of about 45 degrees to 89 degrees with respect to a horizontal plane.

In some embodiments, the base section 207b has a bottom surface 312 and outer sidewall surfaces 315a, as shown in FIG. 5A. The outer sidewall surfaces 315a of the base section 207b taper towards each other as they meet the bottom surface 312. Further, in the embodiments, the side portions of the epitaxial region 208a are removed by etching to form outer sidewall surfaces 315 of the tapered structures and outer sidewall surfaces 315a of the base section. In an optional embodiment (not shown), the side portions of the epitaxial region 208a may be removed such that the outer sidewall surfaces of the base section taper towards each other as they meet the outer sidewall surfaces of the tapered structures. Advantageously, the etching of the side portions of the epitaxial region may increase the spacing between adjacent epitaxial regions, thereby avoiding short-circuit between side portions of adjacent epitaxial regions. More advantageously, as described above, using the two adjacent tapered structures 209 is for the purpose of maximizing the surface area of each epitaxial region 208.

The removal of portions of each epitaxial region may be performed using any suitable dry etch techniques. In one embodiment, the removal is performed using reactive ion etching (ME) technique. Advantageously, as described above, the presence of the hard mask layer may facilitate the formation of tapered portions and adjacent top surfaces in the epitaxial region using dry etch techniques.

Figure 6A:
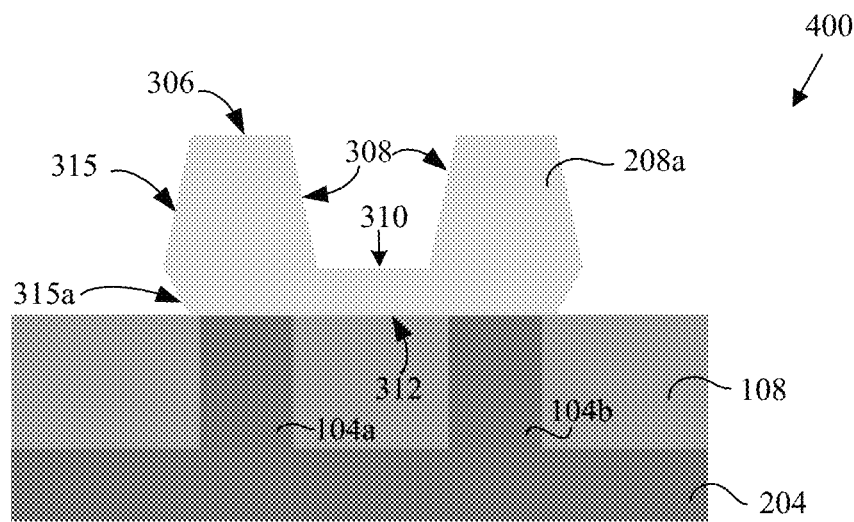
FIGS. 6A, 6B and 6C show cross section views of a partially processed IC structure after removing a portion of a hard mask layer that is overlying the epitaxial region and laterally removing a portion of the hard mask layer that is positioned directly underneath the gate sidewall spacers to form lateral spacer recesses in accordance with some embodiments of the present disclosure.
Figure 6B:
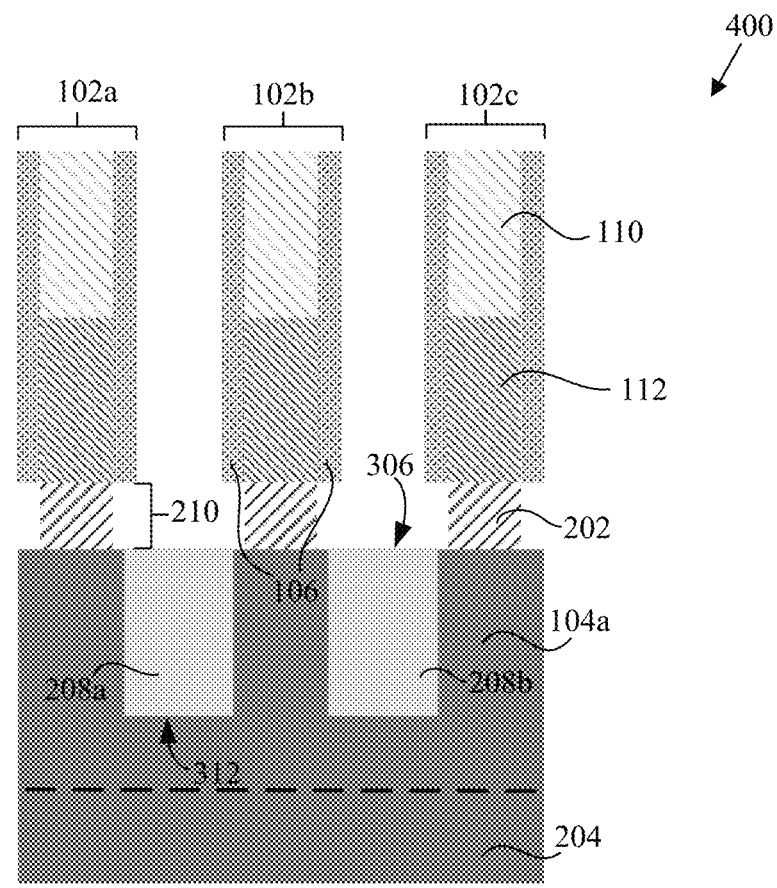
Figure 6C:
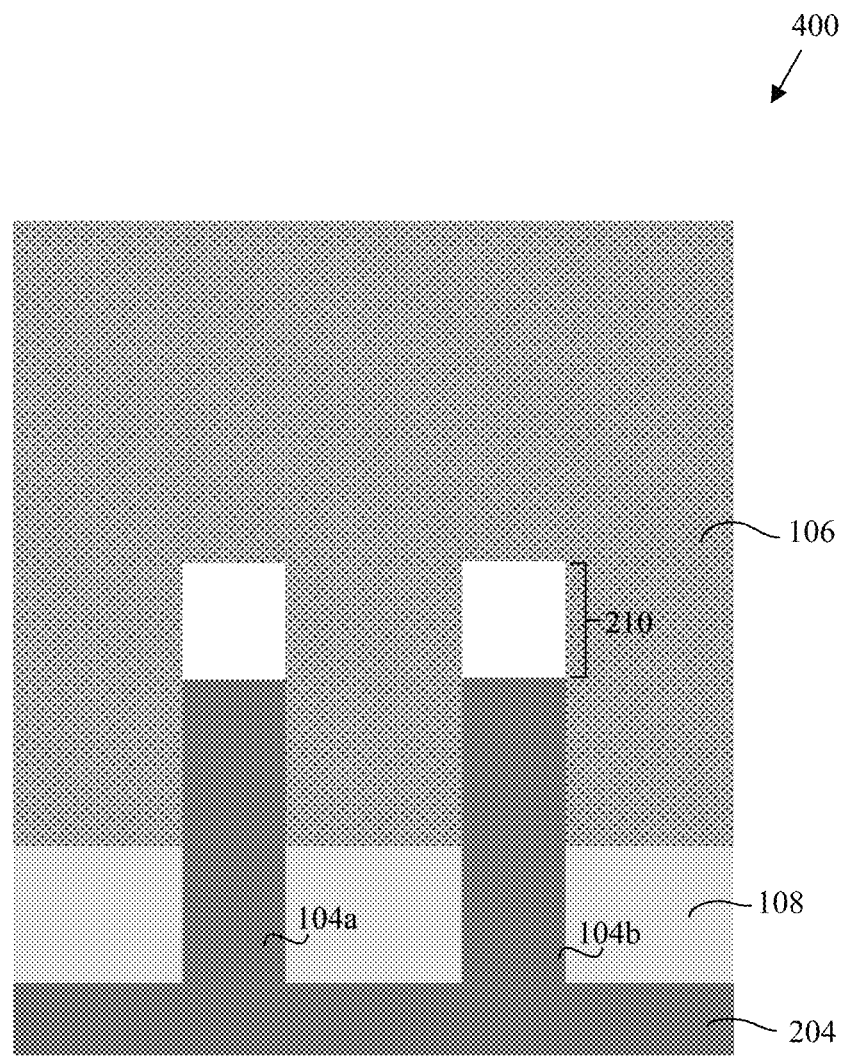

FIGS. 6A, 6B and 6C show cross-sections of a partially processed IC structure 400 after removing a portion of the hard mask layer 202 that is overlying the epitaxial region 208a and 208b and laterally removing a portion of the hard mask layer 202 that is positioned directly underneath the gate sidewall spacers 106 to form lateral spacer recesses 210. The removal of the exposed portion of the hard mask layer 202 overlying the epitaxial region 208a and 208b may be performed by first vertically etching down to reveal the top surfaces 306 of the epitaxial region using any suitable dry etch method. Next, lateral spacer recesses 210 may be formed by an isotropic etching. In some embodiments, only the hard mask layer 202 that is positioned directly underneath the sacrificial gate material 112 remains after the etching steps.

As shown in FIG. 6C, which the cross section corresponding to the section line C-C' shown in FIG. 1, the lateral spacer recesses 210 are positioned directly over each fin 104a and 104b. The isotropic etching step may be controlled by a predetermined time.

Figure 7A:
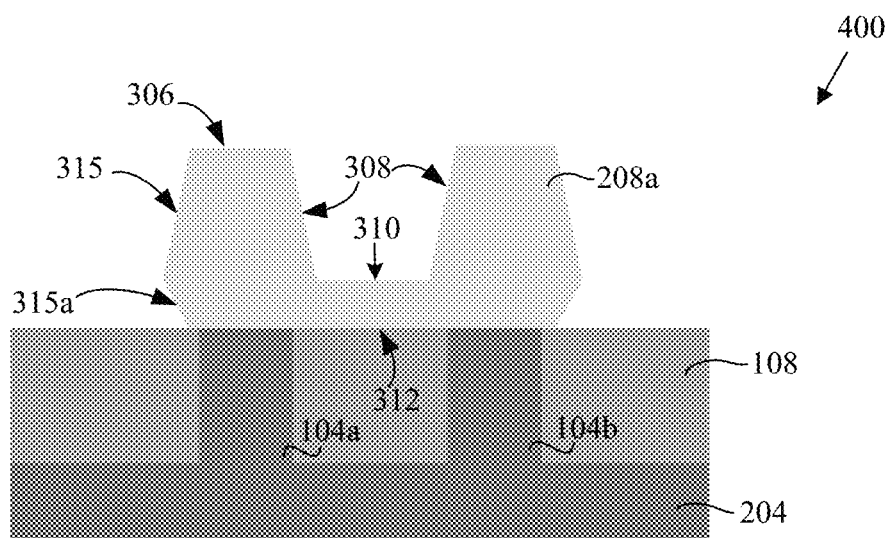
FIGS. 7A, 7B and 7C show cross section views of a partially processed IC structure after filling the lateral spacer recesses to form inner sidewall spacers in accordance with some embodiments of the present disclosure.
Figure 7B:
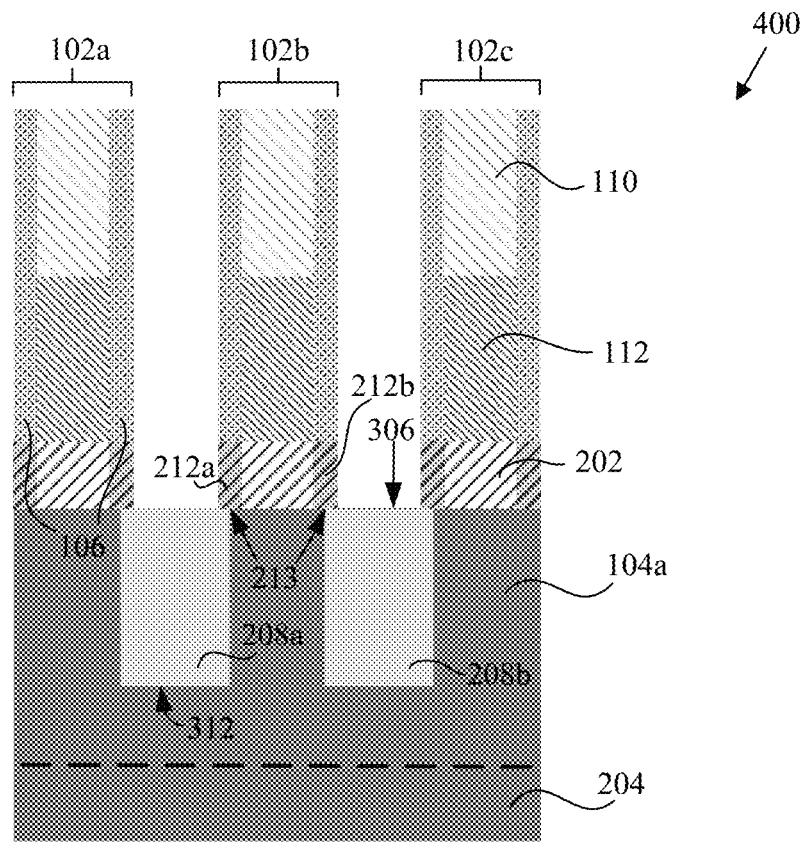
Figure 7C:
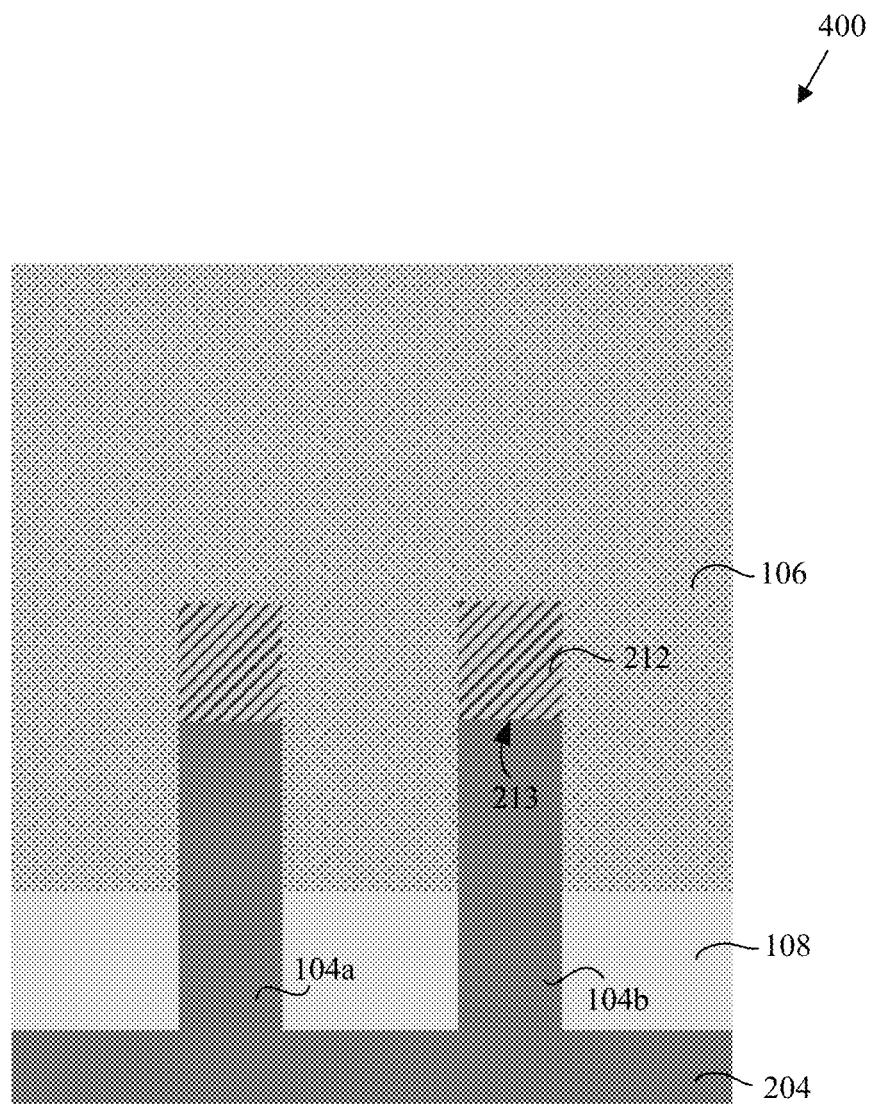

FIGS. 7A, 7B and 7C show cross-sections of a partially processed IC structure 400 after filling the previously formed lateral spacer recesses to form inner sidewall spacers 212. The view in FIG. 7A is identical to FIG. 6A. As shown in FIG. 7B, each dummy gate region has a first inner sidewall spacer 212a and a second inner sidewall spacer 212b that have bottom surfaces 213. In one embodiment, the bottom surface 213 of the first inner sidewall spacer 212a is partially disposed on one epitaxial region 208a, and the bottom surface 213 of the second inner sidewall spacer 212b is partially disposed on another epitaxial region 208b, as shown in FIG. 7B. Advantageously, as described above, having the inner sidewall spacer to be partially disposed on the epitaxial region and partially disposed on the fin secures gate spacer width, and also enables removal of the remaining hard mask material below the gate without damaging the spacer or modifying the spacer width in subsequent processing steps.

As shown in FIG. 7C, which the cross section corresponding to the section line C-C' shown in FIG. 1, each inner sidewall spacer 212 fills the previously formed lateral spacer recess and is disposed on each fin 104a and 104b. The bottom surfaces 213 of the inner sidewall spacers 212 are disposed on the fins 104a and 104b, as shown in FIG. 7C. The lateral spacer recesses may be filled with an insulating material to form inner sidewall spacers 212. In various embodiments, the insulating material may include silicon nitride, silicon carbon oxynitride (SiOCN), silicon boron carbon nitride (SiBCN), or the like.

Figure 8A:
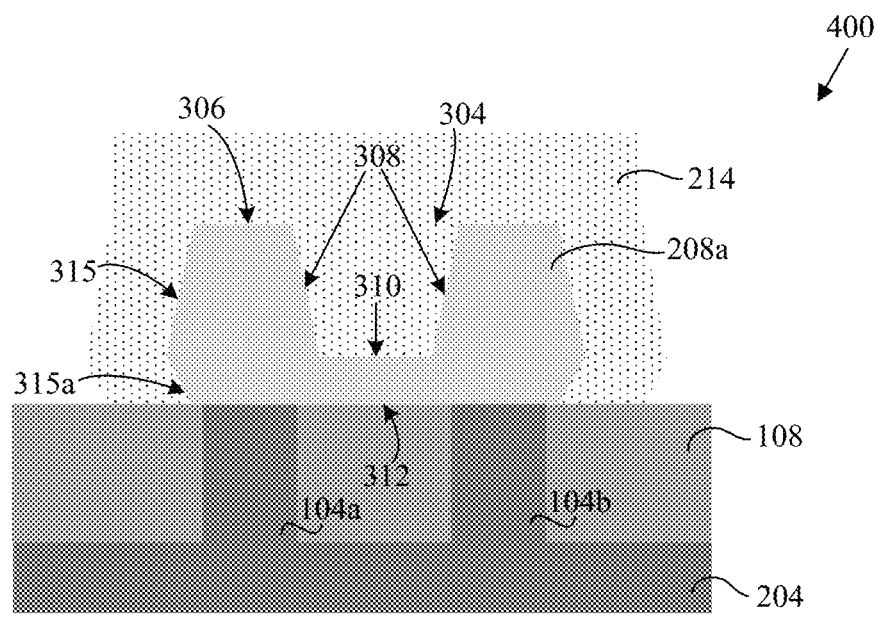
FIGS. 8A and 8B show cross section views of a partially processed IC structure after forming sacrificial dummy contacts on the epitaxial region in accordance with some embodiments of the present disclosure.
Figure 8B:
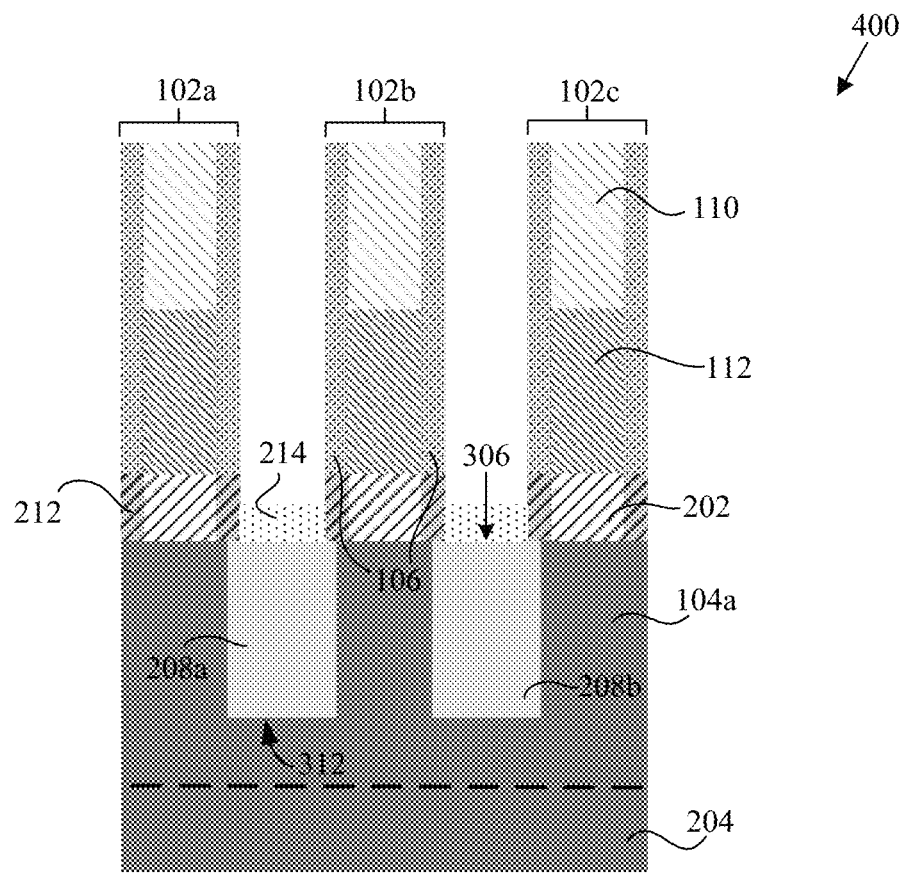

FIGS. 8A and 8B show cross-sections of a partially processed IC structure 400 including sacrificial dummy contacts 214 formed on each epitaxial region 208. The sacrificial dummy contact 214 is formed to conform with the contours of the epitaxial region 208. For example, each sacrificial dummy contact 214 is positioned over and surrounding each epitaxial region 208a. As shown in FIG. 8A, the tapered recess 304 of the epitaxial region 208a is filled with the sacrificial dummy contact 214. As shown in FIG. 8B, the sacrificial dummy contact 214 abuts the inner sidewall spacers 212.

The sacrificial dummy contact 214 may be made of a suitable material, such as silicon, germanium, or a combination of silicon and germanium. The sacrificial dummy contact 214 may be formed by conventional techniques, such as selective epitaxial growth on the epitaxial region 208, or by depositing a layer of material followed by lithographical patterning.

Figure 9A:
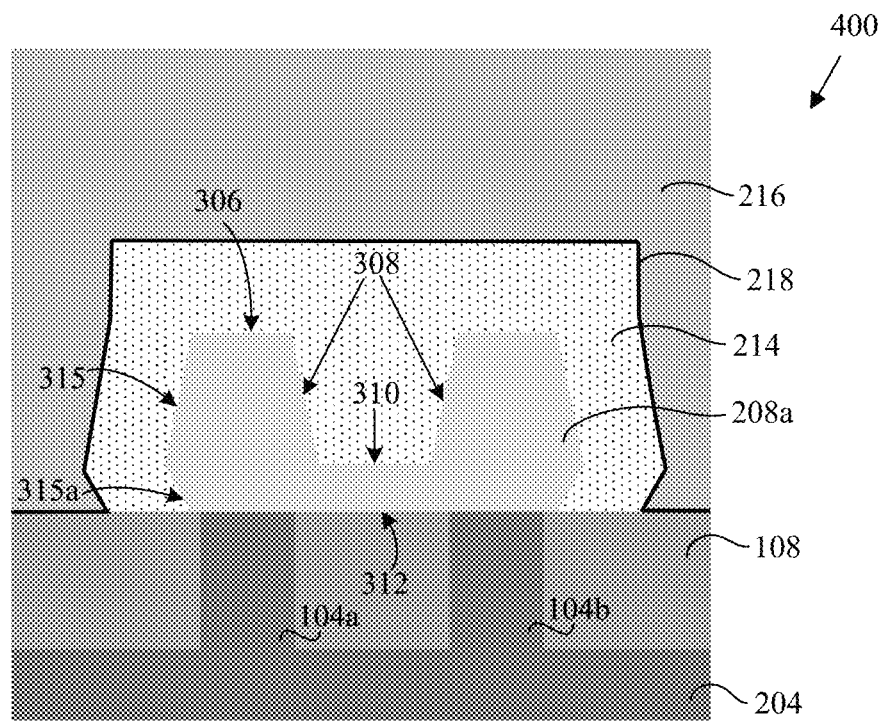
FIGS. 9A and 9B show cross section views of a partially processed IC structure after forming a contact etch stop layer and a first interlayer dielectric over the sacrificial dummy contact in accordance with some embodiments of the present disclosure.
Figure 9B:
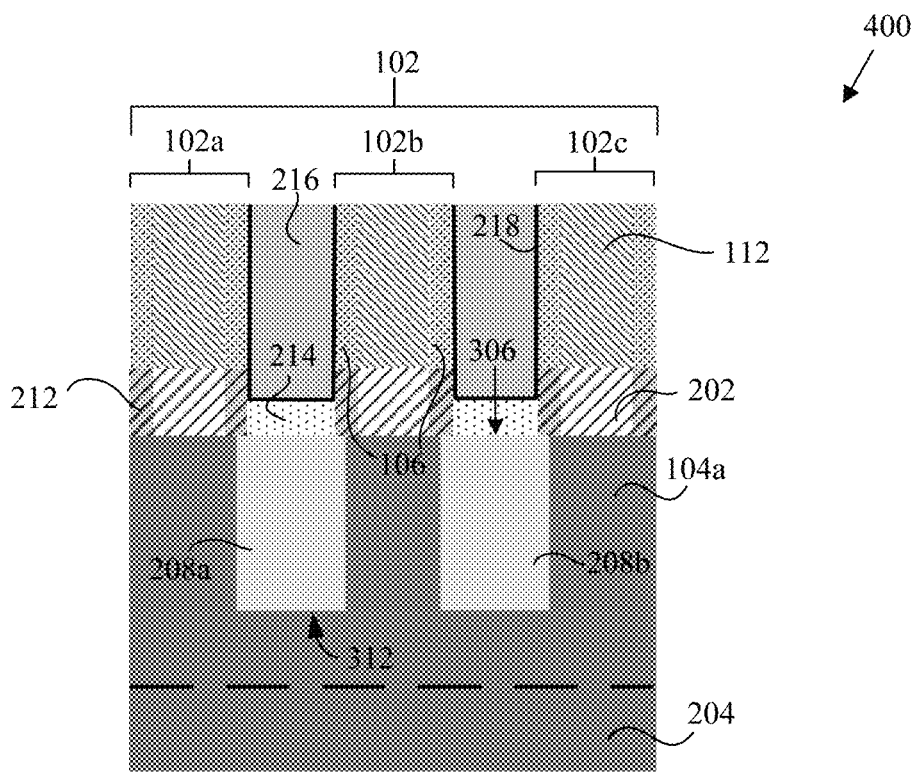

FIGS. 9A and 9B show cross-sections of a partially processed IC structure 400 including a contact etch stop layer 218 and a first interlayer dielectric 216 formed over each sacrificial dummy contact 214. In FIG. 9A, after forming the sacrificial dummy contacts 214 on the epitaxial region 208a, a contact etch stop layer 218 is formed on the sacrificial dummy contacts 214 by any suitable deposition techniques.

In one embodiment, the contact etch stop layer 218 is deposited onto the sacrificial dummy contact 214 by chemical vapor deposition (CVD). Each gate sidewall spacer 106 is lined with the contact etch stop layer 218. The material for the contact etch stop layer 218 may be a silicide compound, a nitride compound, a carbide compound, or a carbon nitride compound. In some embodiments, the contact etch stop layer is preferably silicon nitride, or silicon carbon nitride (SiCN).

A first interlayer dielectric 216 may be deposited on the contact etch stop layer 218. The first interlayer dielectric 216 may be disposed in between each dummy gate region 102a, 102b and 102c. In one embodiment, the first interlayer dielectric 216 is deposited by CVD. As shown in FIG. 9B, the first interlayer dielectric 216 is further treated with chemical mechanical planarization (CMP) to be planar with the dummy gate regions 102. The CMP also removes the protective cap of the dummy gate regions 102 and expose the sacrificial gate material 112.

Figure 10A:
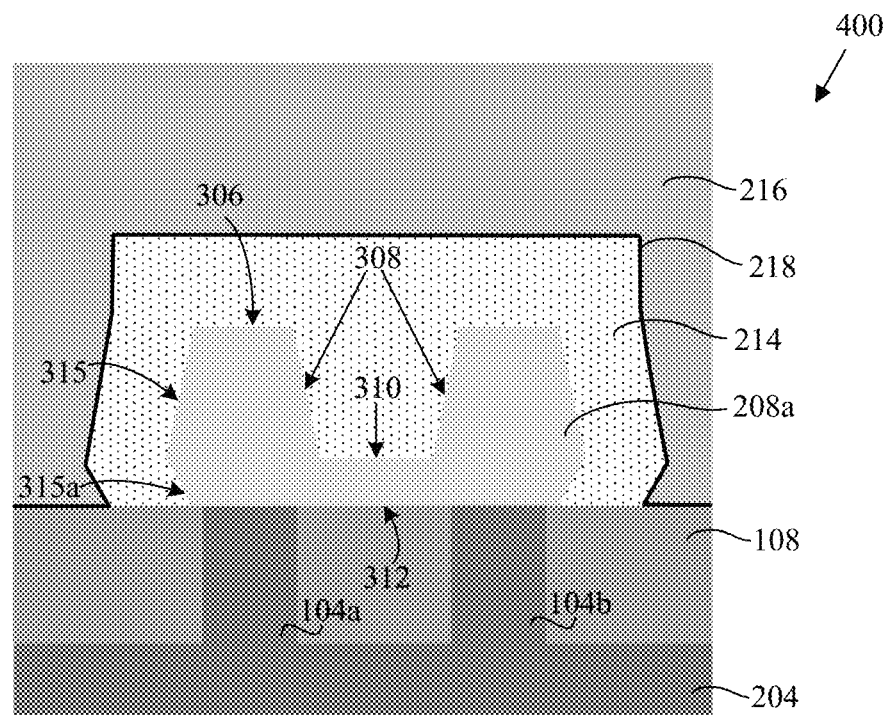
FIGS. 10A and 10B show cross section views of a partially processed IC structure including gate openings positioned between gate sidewall spacers in accordance with some embodiments of the present disclosure.
Figure 10B:
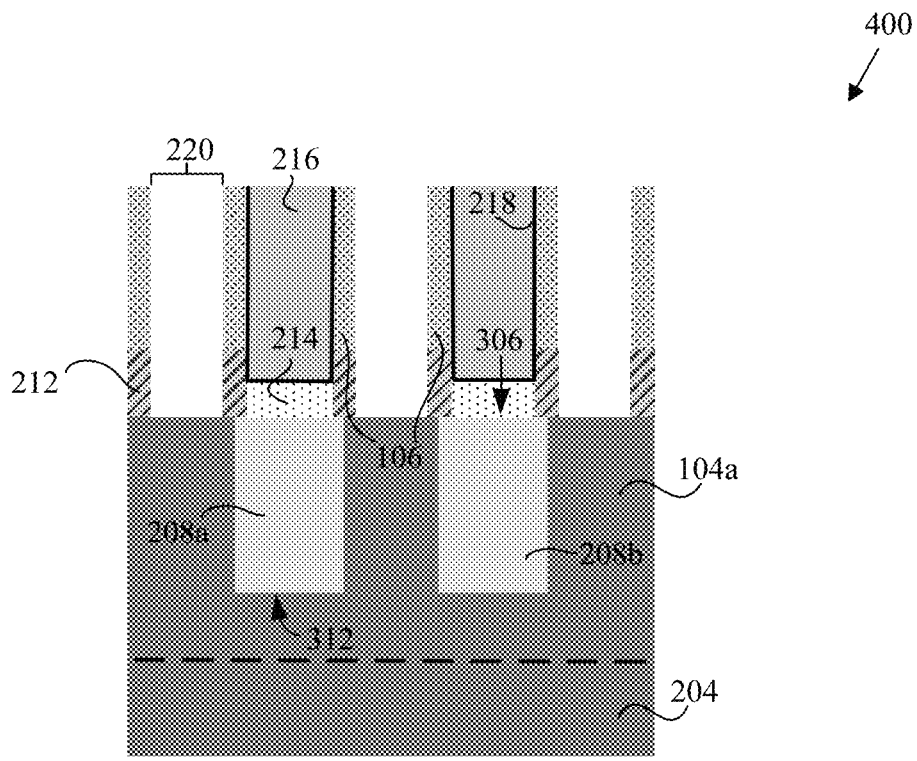

FIGS. 10A and 10B show cross-sections of a partially processed IC structure 400 including gate openings 220 positioned between gate sidewall spacers 106. Each gate opening 220 is formed by removing the sacrificial gate material and the hard mask layer underneath the sacrificial gate material. The removal of the sacrificial gate material and the hard mask layer underneath the sacrificial gate material may be performed by etching or any other method of removing semiconductor material. Advantageously, during removal of the hard mask layer underneath the sacrificial gate material, the presence of the inner sidewall spacers 212 confines the removal process between the gate sidewall spacers 106 and protects the epitaxial region 208a and 208b.

Figure 11A:
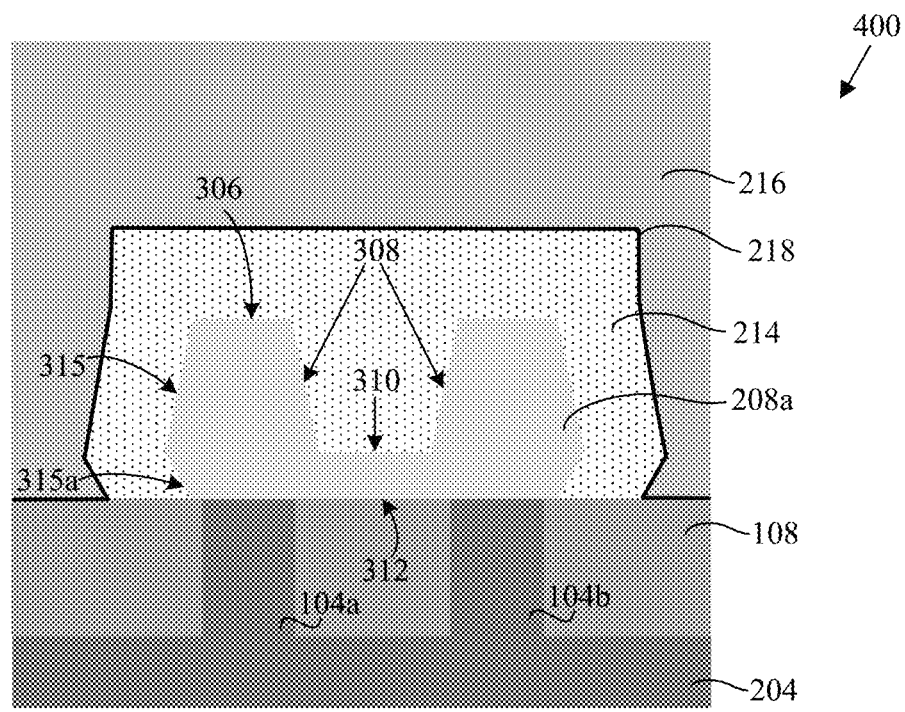
FIGS. 11A and 11B show cross section views of a partially processed structure after forming a gate region in place of the previous dummy gate region in accordance with some embodiments of the present disclosure.
Figure 11B:
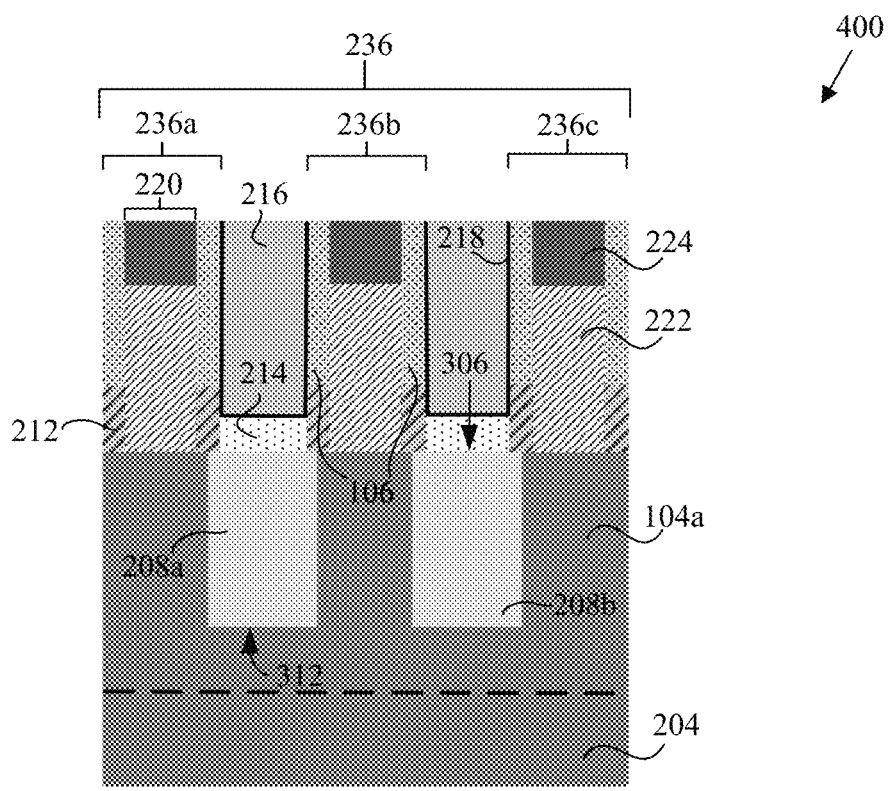

FIGS. 11A and 11B show cross-sections of a partially processed IC structure 400 including at least one gate region 236. Each gate region 236a, 236b and 236c is laterally disposed on the fins 104a and 104b and positioned between the one epitaxial region 208a and another epitaxial region 208b. The gate region 236a, 236b and 236c is formed by filling each gate opening 220 with a gate material 222 and a gate cap 224. The filling of each gate opening 220 may be performed by any replacement metal gate (RMG) process. It should be understood that the RMG process is described at this point in the sequence as an example. The RMG process will be apparent to those of ordinary skill in the art without departing from the scope and spirit of this disclosure. A CMP process is carried out to enable each gate region 236a, 236b and 236c to be planar with the first interlayer dielectric 216.

The gate material 222 may include an electrically conductive metal. In one embodiment, the electrically conductive metal is preferably tungsten. The gate material 222 may also include additional gate dielectric structures to provide further electrical isolation or to improve gate operating parameters. Examples of gate dielectric materials may include but are not limited to hafnium silicate (HfSiO), hafnium oxide (HfO$_2$), zirconium silicate (ZrSiO$_x$), zirconium oxide (ZrO$_2$), silicon oxide (SiO$_2$), silicon nitride (Si$_3$N$_4$), silicon oxynitride (SiON), high-k material or any combination of these materials. The gate cap 224 may be made of an insulating material. In another embodiment, the gate cap 224 is preferably made of silicon nitride.

Figure 12A:
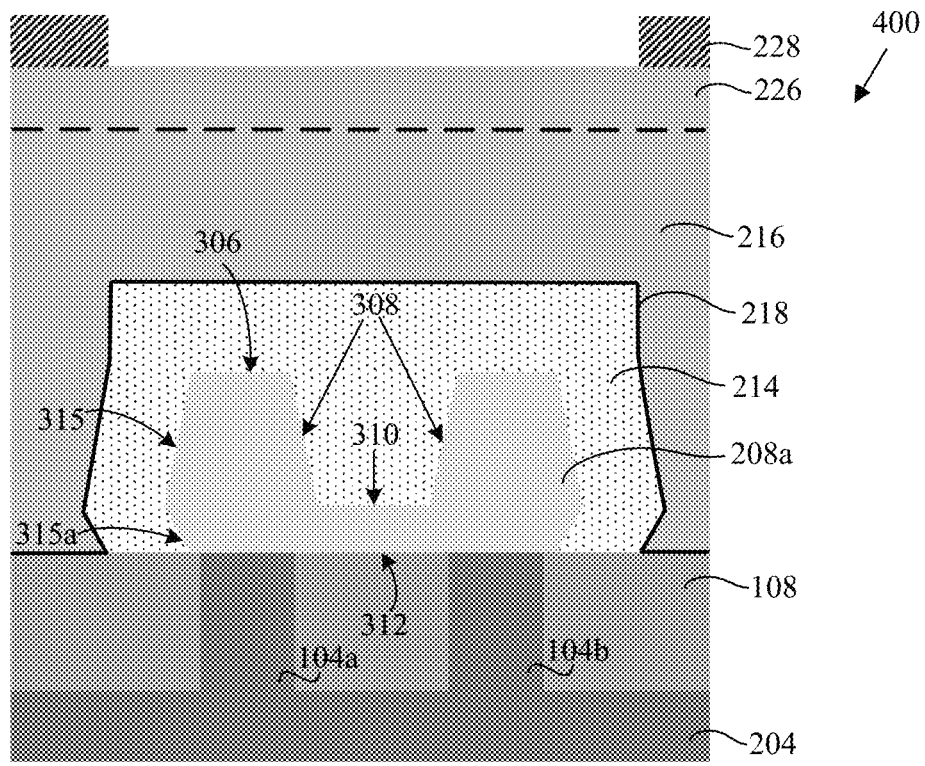
FIGS. 12A and 12B show cross section views of a partially processed structure after forming a second interlayer dielectric over the first interlayer dielectric followed by forming a masking layer over the second interlayer dielectric in accordance with some embodiments of the present disclosure.
Figure 12B:
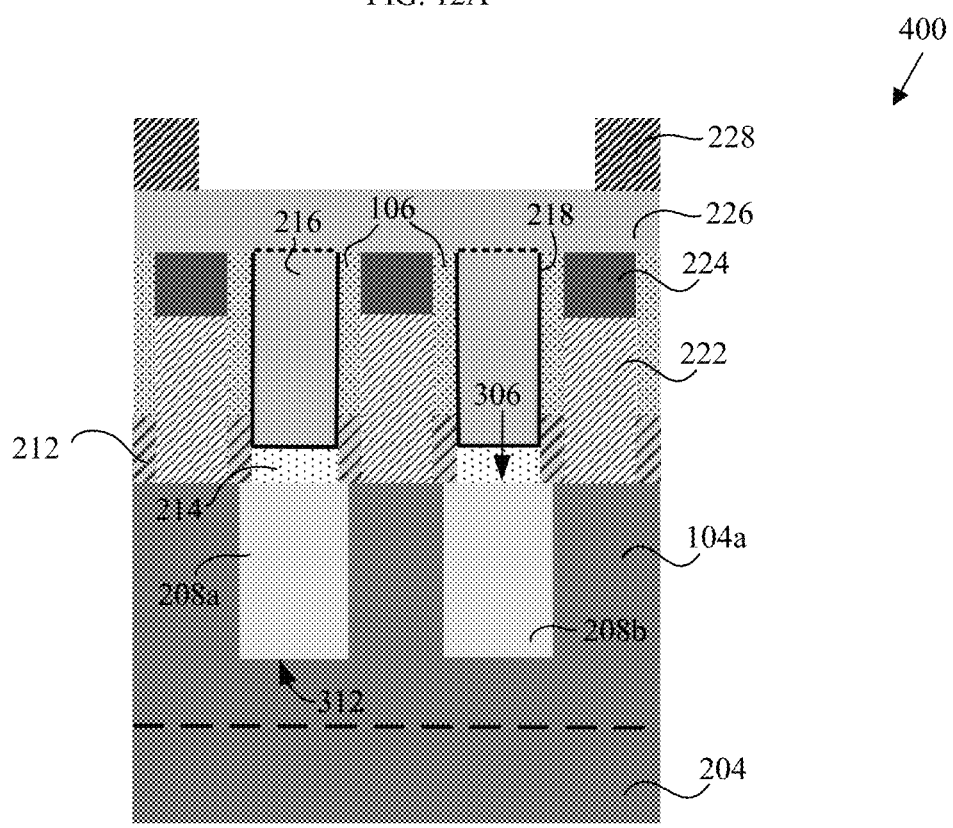

FIGS. 12A and 12B show cross-sections of a partially processed IC structure 400 including a second interlayer dielectric 226 formed over the first interlayer dielectric 216 and the gate cap 224, and a masking layer 228 formed over the second interlayer dielectric 226. In one embodiment, the second interlayer dielectric 226 is deposited by CVD. The masking layer 228 may be formed on the second interlayer dielectric 226 by depositing a masking material followed by lithographical patterning. The masking layer may be an organic planarization layer and may include any suitable photo-sensitive organic material such as polyacrylate resin, epoxy resin, phenol resin, polyamide resin, polyimide resin, unsaturated polyester resin, polyphenylenether resin, polyphenylenesulfide resin, or benzocyclobutene (BCB).

The first interlayer dielectric 216 and the second interlayer dielectric 226 may include any dielectric material including inorganic dielectric materials, organic dielectric materials, or combinations thereof. Suitable dielectric materials include but are not limited to: silicon nitride (Si$_3$N$_4$), silicon dioxide (SiO$_2$), carbon-doped silicon dioxide materials; fluorinated silicate glass (FSG); boro-phospho-silicate glass (BPSG); organic polymeric thermoset materials; silicon oxycarbide; SiCOH dielectrics; fluorine doped silicon oxide; spin-on glasses; silsesquioxanes, including hydrogen silsesquioxane (HSQ), methyl silsesquioxane (MSQ) and mixtures or copolymers of HSQ and MSQ; benzocyclobutene (BCB)-based polymer dielectrics, and any silicon-containing low-k dielectric. In one embodiment, it is preferred that the first interlayer dielectric 216 includes silicon dioxide and the second interlayer dielectric 226 includes silicon dioxide.

Figure 13A:
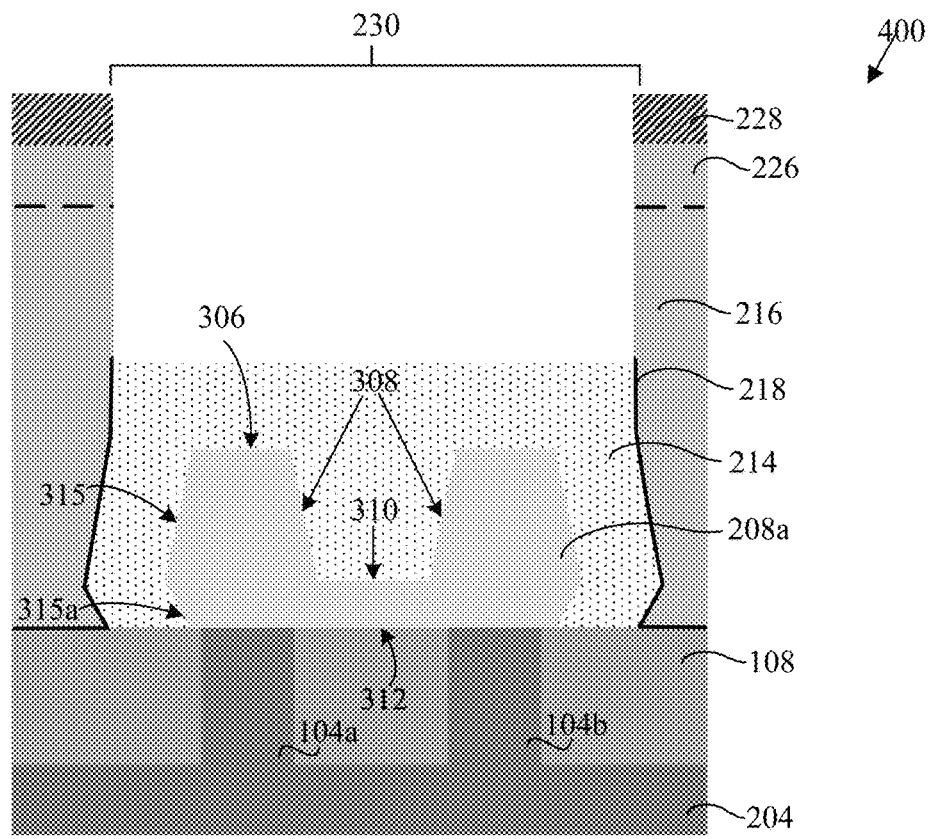
FIGS. 13A and 13B show cross section views of a partially processed structure after forming a contact cavity in the first and second interlayer dielectric in accordance with some embodiments of the present disclosure.
Figure 13B:
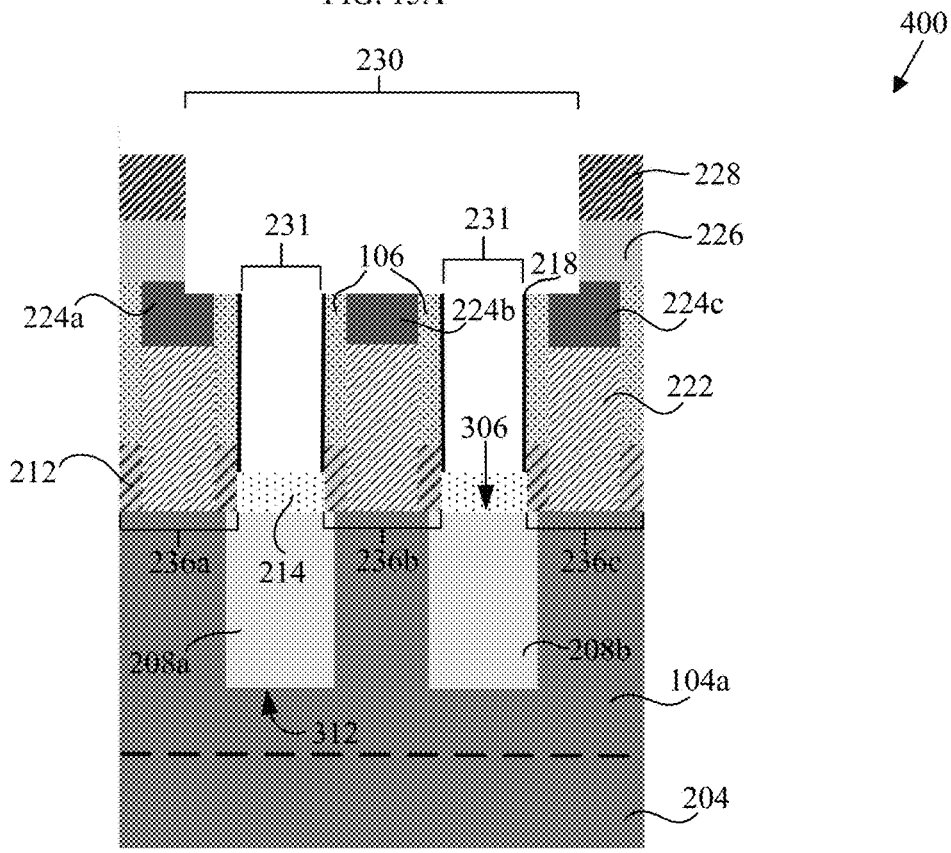

FIGS. 13A and 13B show cross-sections of a partially processed IC structure 400 after forming a contact cavity 230 in the first interlayer dielectric 216 and the second interlayer dielectric 226. The contact cavity 230 is formed over each epitaxial region 208 and may include dielectric openings 231. Formation of the contact cavity 230 and the dielectric openings 231 may be performed by any suitable method of removing semiconductor material, such as etching. In some embodiments, the etching is performed by RIE. In some embodiments, the etching process is initially stopped by the contact etch stop layer 218, and then continued with an over etch to remove a portion of the contact etch stop layer 218 to reveal the sacrificial dummy contact 214.

In the embodiments, the etching process to form the contact cavity 230 and the dielectric openings 231 involves an etching process that is oxide selective. The etching process etches through the second interlayer dielectric 226 and removes a portion of the first interlayer dielectric previously overlying the sacrificial dummy contact 214 to form the dielectric openings 231. A portion of the contact etch stop layer 218 is then removed to reveal the sacrificial dummy contact 214, as shown in FIG. 13B. The process of removing a portion of the contact etch stop layer 218 may also remove a portion of each gate caps 224a, 224b and 224c and the gate sidewall spacers 106 in each gate region 236a, 236b and 236c, as shown in FIG. 13B. The dielectric openings 231 are each positioned between each gate region 236a, 236b and 236c.

Figure 14A:
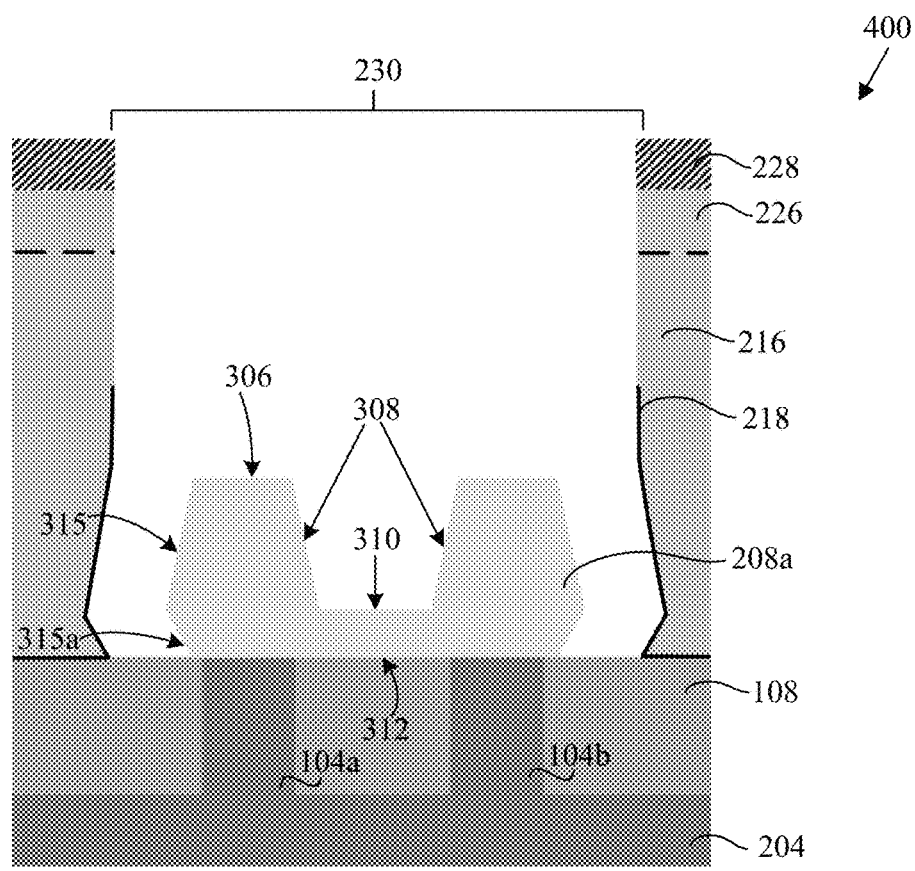
FIGS. 14A and 14B show cross section views of a partially processed structure after removing the sacrificial dummy contact in accordance with some embodiments of the present disclosure.
Figure 14B:
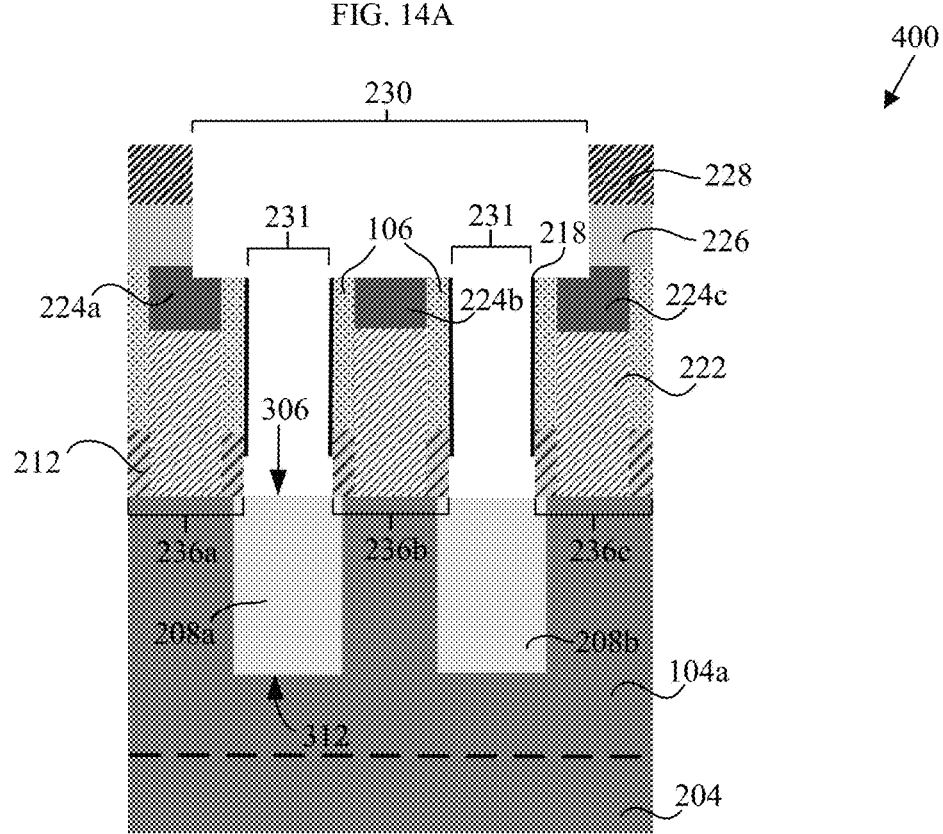

FIGS. 14A and 14B show cross-sections of a partially processed IC structure 400 after removal of the sacrificial dummy contact. The sacrificial dummy contact may be removed by a wet etch process to expose the epitaxial region 208a and 208b. After removal of the sacrificial dummy contact, the contact cavity 230 surrounds each epitaxial region 208a and 208b.

In some embodiments, the sacrificial dummy contact is removed to expose the surfaces of the epitaxial region 208a and 208b. A cleaning process may be performed by treating the exposed surfaces of the epitaxial region 208a and 208b with oxygen plasma. Additionally, an ion implantation process may be performed to dope the epitaxial regions 208a and 208b such that the epitaxial regions 208a and 208b function as either a source or a drain in a FET. In various embodiments, the dopants may include, but not limited to, boron or phosphorous. In some embodiments, the doped epitaxial region preferably includes boron doped silicon germanium for a p-channel FET, and phosphorous doped silicon for a n-channel FET.

Advantageously, the formation and subsequently removal of the sacrificial dummy contact enables the overall shape of the epitaxial region to be maintained throughout the process step without causing degradation to the surface profile and shape of each epitaxial region. More advantageously, the tapered portions of the epitaxial regions may improve the efficiency of the cleaning and ion implantation processes.

Figure 15A:
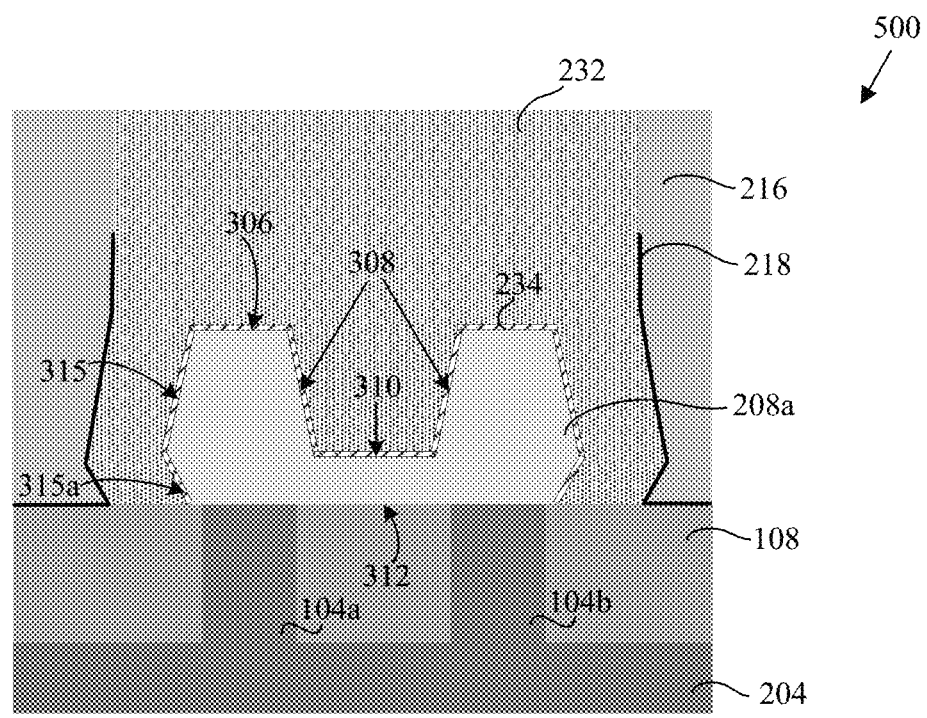
FIGS. 15A and 15B show cross section views of one embodiment of the IC structure as described herein.
Figure 15B:
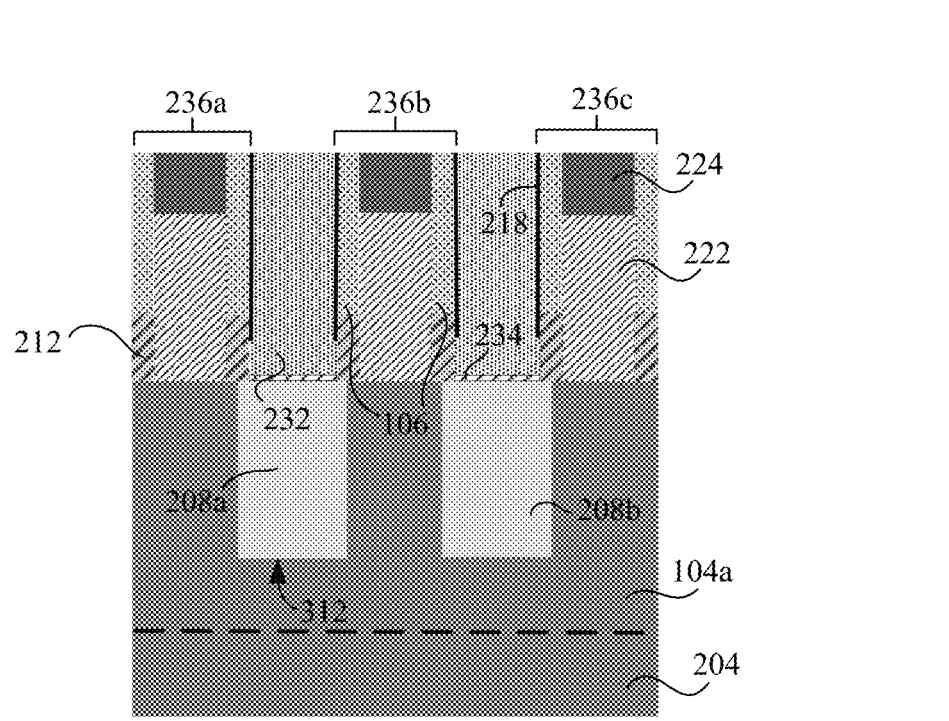

FIGS. 15A and 15B show cross-sections of an IC structure 500 formed after filling the contact cavity with a contact material 232. Each contact material 232 is positioned over and surrounding each epitaxial region 208a and 208b. In some embodiments, the contact material 232 surrounds the outer sidewall surfaces 315 and the inner sidewall surfaces 308 of the tapered structures, the outer sidewall surfaces 315a of the base section, the top surfaces 306, and the recess bottom surface 310 of the epitaxial region 208a and 208b. The contact material 232 may overfill the previously formed contact cavity. An ashing process (e.g. plasma ashing) may be performed to remove the masking layer prior to filling the contact cavity. CMP may be performed to remove the second interlayer dielectric and also ensure that the contact material 232 is planar with the first interlayer dielectric 216 and the gate region 236, as shown in FIGS. 15A and 15B. The contact material 232 may be deposited on the epitaxial region 208a and 208b by any suitable deposition techniques.

The contact material 232 may be an electrically conductive metal, including one of more of tungsten (W), ruthenium (Ru), cobalt (Co), copper (Cu), titanium (Ti), nickel (Ni), platinum (Pt) or aluminum (Al). In some embodiments, the contact material 232 is preferably Ti, which is deposited on each epitaxial region 208a and 208b by CVD, and followed by atomic layer deposition (ALD) of either Ru, Co, or W.

A contact liner 234 may be interposed between each epitaxial region 208a and 208b and each contact material 232. The contact liner 234 may be formed by a chemical reaction between the contact material 232 and the epitaxial region 208a and 208b. Optionally, an annealing process may be additionally performed to form the contact liner 234. The contact liner 234 may include a silicide material. In various embodiments, the silicide material may include, but not limited to, titanium silicide, nickel silicide, nickel-platinum silicide.

Advantageously, as described above, the formation of tapered portions in the epitaxial region increases the surface area available for the contact material to surround the epitaxial region. More advantageously, the configuration of the tapered recesses and tapered structures are found to maximize contact area between contact material and epitaxial region and at the same time, reducing contact resistance in an IC structure, thereby improving performance of devices.

Figure 16:
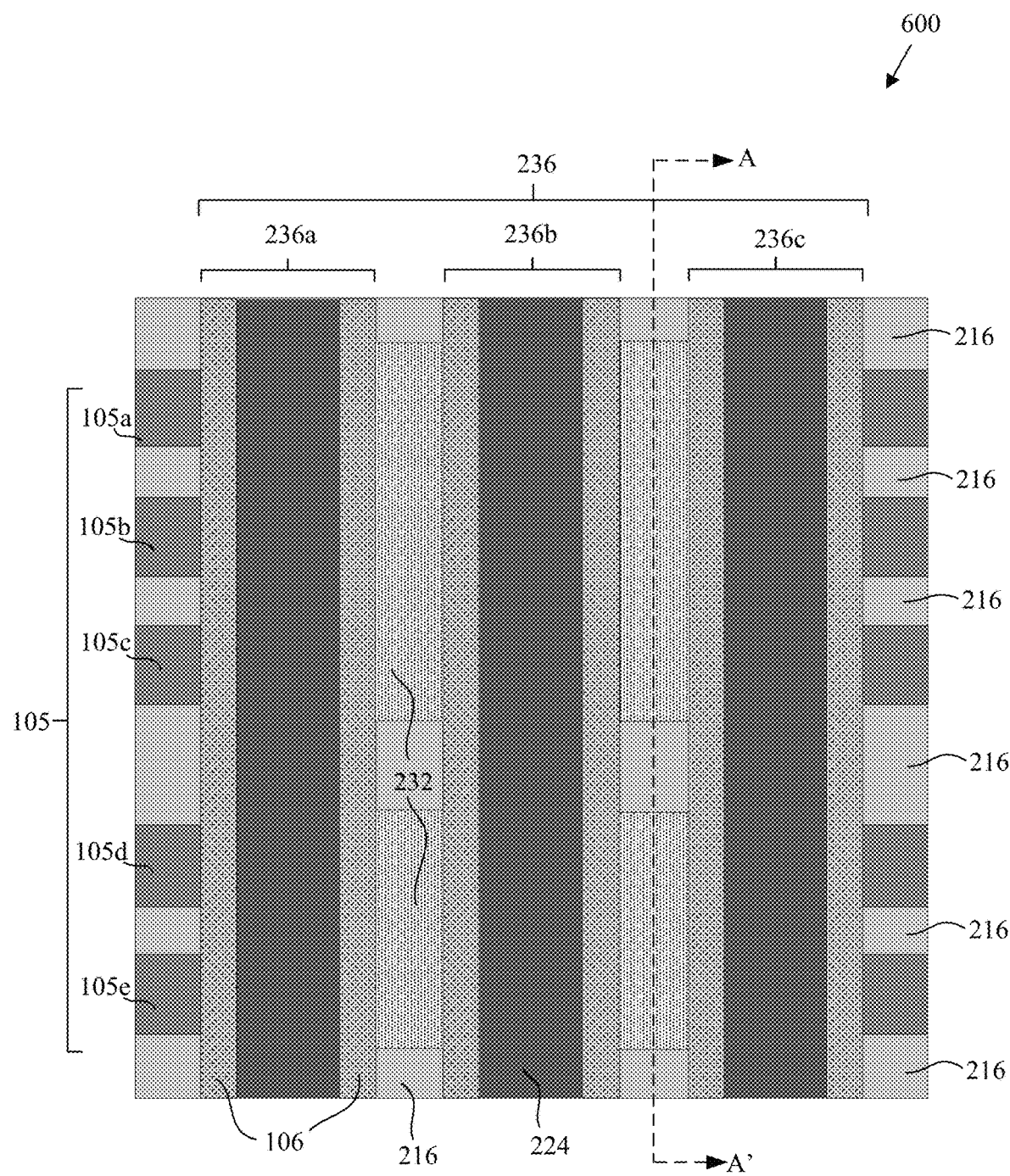
FIG. 16 shows a top-down view of another embodiment of an IC structure as described herein. The line A-A' designates a cross section location for FIG. 17.
Figure 17:
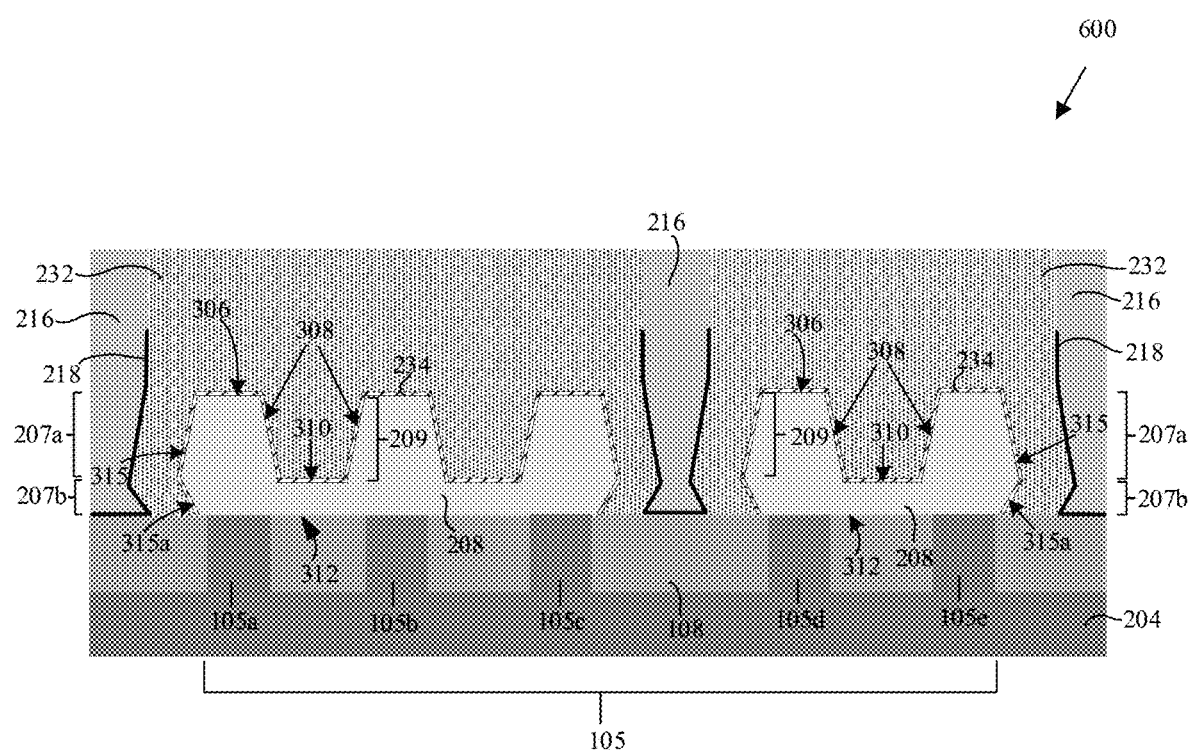
FIG. 17 shows a cross section view of the embodiment of the IC structure shown in FIG. 16.

FIGS. 16 and 17 show another embodiment of the IC structure 600 formed according to the method of the present disclosure. FIG. 16 is a top-down view of the IC structure 600 and FIG. 17 is a cross-sectional view of the IC structure 600 along a line corresponding to the section line A-A' in FIG. 16.

As shown in FIG. 16, an alternative embodiment IC structure 600 includes three gate regions 236 disposed on a plurality of fins 105 and extends laterally across fins 105a, 105b, 105c, 105d and 105e. Each fin 105a, 105b, 105c, 105d and 105e is separated by a first interlayer dielectric 216. Contact materials 232 are disposed between two adjacent gate regions 236a, 236b and 236c and are separated from one another by the first interlayer dielectric 216.

As shown in FIG. 17, the IC structure 600 includes two epitaxial regions 208 disposed on a plurality of fins 105—a first epitaxial region over selected fins 105a, 105b and 105c, and a second epitaxial region over selected fins 105d and 105e. The first epitaxial region and the second epitaxial region are isolated by the first interlayer dielectric 216. The epitaxial regions 208 have tapered portions having top sections 207a and base sections 207b. The base sections 207b are adjoining and wider than the top sections 207a of each epitaxial region 208. Each top section 207a includes at least two adjacent tapered structures 209 having top surfaces 306 and outer sidewall surfaces 315, and at least one tapered recess 304, as shown in FIG. 17. Additionally, as shown in FIG. 17, the tapered recess 304 is positioned between the tapered structures 209 and forms inner sidewall surfaces 308 of the tapered structure 209. The tapered recess 304 has a recess bottom surface 310. Further, each base section 207b includes a bottom surface 312 and outer sidewall surfaces 315a, as shown in FIG. 17. Contact materials 232 are positioned over and surrounding each epitaxial region 208 and separated from one another by the first interlayer dielectric 216.

As used herein, the term "deposition" generally refers to the process of applying a material over another material (or the substrate). CVD and ALD are common techniques for depositing materials. Other "deposition" techniques, such as for applying resist or glass, may include "spin-on", which generally involves providing a stream of material to the substrate, while the substrate is spinning, resulting in a relatively thin, flat, evenly-distributed coating of the material on the underlying substrate.

Throughout this disclosure, the terms top, upper, upwards, over, and above refer to the direction away from the substrate. Likewise, the terms bottom, lower, downwards, under, and below refer to the direction towards the substrate.

Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein. Furthermore, there is no intention to be bound by any theory presented in the preceding background or the detailed description.

Additionally, the various tasks and processes described herein may be incorporated into a more comprehensive procedure or process having additional functionality not described in detail herein. In particular, various processes in the manufacture of integrated circuits are well-known and so, in the interest of brevity, many conventional processes are only mentioned briefly herein or omitted entirely without providing the well-known process details.

As will be readily apparent to those skilled in the art upon a complete reading of the present application, the IC structures and method disclosed herein may be employed in manufacturing a variety of different integrated circuit products, including, but not limited to, logic products, memory products, etc.

What is claimed is:

1. An integrated circuit (IC) structure comprising:
a plurality of fins disposed on a semiconductor substrate;
at least one epitaxial region laterally disposed on selected fins, wherein the epitaxial region has tapered portions positioned over the selected fins,
the tapered portions comprising base sections and top sections, wherein the base sections are adjoining and wider than the top sections; and
a contact material positioned over and surrounding the epitaxial region.

2. The IC structure of claim 1, further comprising a contact liner between the epitaxial region and the contact material.

3. The IC structure of claim 1, wherein each top section comprises at least two tapered structures having outer sidewall surfaces and top surfaces and at least one tapered recess.

4. The IC structure of claim 3, wherein the top surfaces of the tapered structures are spaced apart from each other.

5. The IC structure of claim 3, wherein the tapered recess is positioned between the tapered structures and forms inner sidewall surfaces of the tapered structures.

6. The IC structure of claim 5, wherein each tapered structure has their outer sidewall surface and inner sidewall surface taper towards each other as they meet the top surface.

7. The IC structure of claim 5, wherein the inner sidewall surfaces of the tapered structures have angles in the range of 45 degrees to 89 degrees with respect to a horizontal plane.

8. The IC structure of claim 1, wherein each base section comprises a bottom surface and outer sidewall surfaces.

9. The IC structure of claim 8, wherein the outer sidewall surfaces taper towards each other as they meet the bottom surface.

10. The IC structure of claim 1, further comprising:
at least one gate region laterally disposed on the selected fins, wherein the gate region comprises a gate with first and second inner sidewall spacers; and
the gate region is positioned between the one epitaxial region and another epitaxial region.

11. The IC structure of claim 10, wherein a bottom surface of the first inner sidewall spacer is partially disposed on the one epitaxial region and a bottom surface of the second inner sidewall spacer is partially disposed on the another epitaxial region.

12. An IC structure comprising:
a plurality of fins disposed on a semiconductor substrate;
at least one epitaxial region laterally disposed on selected fins, wherein the epitaxial region has tapered portions positioned over the selected fins, and the one epitaxial region is separated from another epitaxial region by an interlayer dielectric,
the tapered portions comprising base sections and top sections, wherein the base sections are adjoining and wider than the top sections; and
at least one contact material positioned over and surrounding the epitaxial region, wherein the one contact material is separated from another contact material by the interlayer dielectric.

13. The IC structure of claim 12, wherein each top section comprises at least two tapered structures having outer sidewall surfaces and top surfaces and at least one tapered recess.

14. The IC structure of claim 13, wherein the tapered recess is positioned between the tapered structures and forms inner sidewall surfaces of the tapered structures.

15. A method of forming an integrated circuit (IC) structure comprising:
forming a device structure having a plurality of fins disposed on a semiconductor substrate;
forming at least one epitaxial region that extends laterally across selected fins, wherein the epitaxial region has tapered portions positioned over the selected fins,
the tapered portions comprising base sections and top sections, wherein the base sections are adjoining and wider than the top sections; and
forming a contact material over and surrounding the epitaxial region.

16. The method of claim 15, wherein the forming the epitaxial region comprises initially growing diamond-shaped structures in the cavities that are followed by lateral growth that merges adjacent diamond shaped structures.

17. The method of claim 15, wherein the forming of the contact material over and surrounding the epitaxial region includes forming a contact liner between the contact material and the epitaxial region.

18. The method of claim 15, wherein forming the epitaxial region that extends laterally across the selected fins comprises:
etching the selected fins to form cavities under a hard mask layer disposed on the plurality of fins;
filling the cavities by forming the epitaxial region that extends laterally across the selected fins; and
removing portions of the epitaxial region to form the tapered portions.

19. The method of claim 18, wherein the removing portions of the epitaxial region comprises etching to form the top sections that include tapered structures positioned over the selected fins.

20. The method of claim 19, wherein the removing portions of the epitaxial region comprises removing side portions of the epitaxial region to form tapered outer sidewall surfaces of the tapered structures and tapered outer sidewall surfaces of the base sections.

* * * * *